(12) United States Patent
Ohnuma

(10) Patent No.: US 6,391,501 B1
(45) Date of Patent: May 21, 2002

(54) PATTERN GENERATING METHOD AND APPARATUS

(75) Inventor: Hidetoshi Ohnuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/236,234

(22) Filed: Jan. 22, 1999

(30) Foreign Application Priority Data

Jan. 23, 1998 (JP) .......................................... 10-011334

(51) Int. Cl.⁷ ................................................ G03F 9/00
(52) U.S. Cl. ................................ 430/22; 430/5; 430/30
(58) Field of Search ............................. 430/5, 313, 30, 430/22

(56) References Cited

U.S. PATENT DOCUMENTS

| | | | | |
|---|---|---|---|---|
| 5,766,806 A | * | 6/1998 | Spence ........................... | 430/5 |
| 5,795,683 A | * | 8/1998 | Uno et al. ...................... | 430/5 |
| 5,858,580 A | | 1/1999 | Wang et al. ................... | 430/5 |

FOREIGN PATENT DOCUMENTS

EP 0698916 A 2/1996

OTHER PUBLICATIONS

Ohi et al. "Method of Design of Phase–Shifting Mask Utilizing Compactor" JJAP, vol. 33 (1994), No. 12B, pp. 6774–6778.

Tamechika et al. "Automatic Generation of Phase–shifting Mask Patterns Using Shifter–Edge Lines", Micro–and–Nano–Engineering '97.

* cited by examiner

Primary Examiner—Mark F. Huff
Assistant Examiner—Saleha R. Mohamedulla
(74) Attorney, Agent, or Firm—Ronald P. Kananen, Esq.; Rader, Fishman & Grauer, PLLC

(57) ABSTRACT

A mask pattern generating method and pattern generating apparatus capable of automatically arranging phase shifters efficiently without any discrepancies and to correct a line width difference caused by different densities of fine patterns; wherein shapes and phases of a plurality of phase shift patterns are determined based on positional relationships of a plurality of fine patterns, and the phases are determined so as to give a phase difference of the two sides of the fine patterns of 180 degrees. For example, a plurality of fine patterns are extracted from already designed element shape patterns, unit patterns of at least a predetermined width required for canceling light interference are arranged at the two sides in the direction of fine line width for each of the extracted plurality of the fine patterns, and a plurality of phase shift patterns are generated by OR processing of the unit patterns etc. Further, when there is a phase mismatch giving a phase difference of 0 degree, the phase mismatch is eliminated by changing the pattern such as dividing the shift pattern after layout compression etc. in accordance with need.

10 Claims, 19 Drawing Sheets

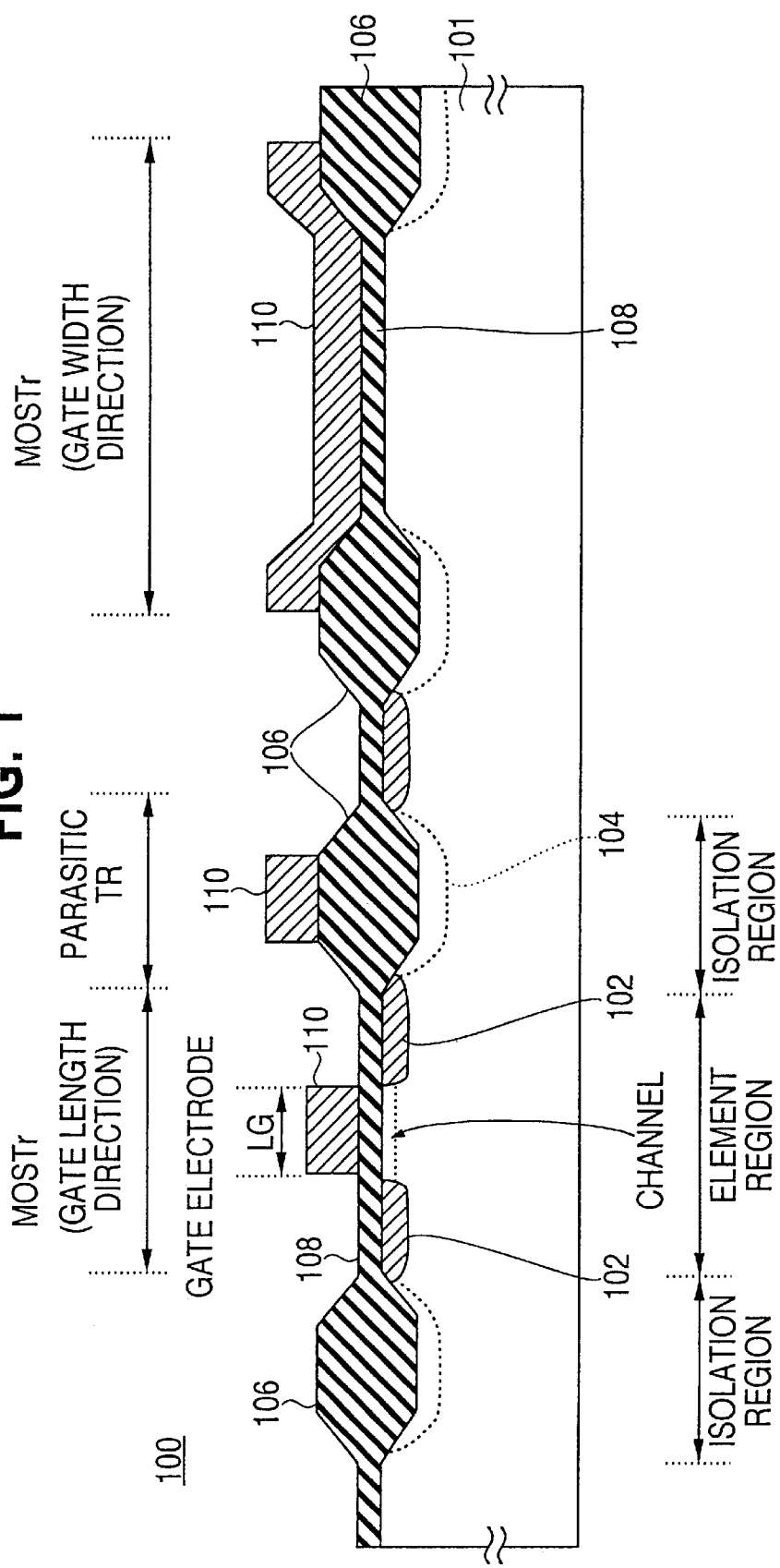

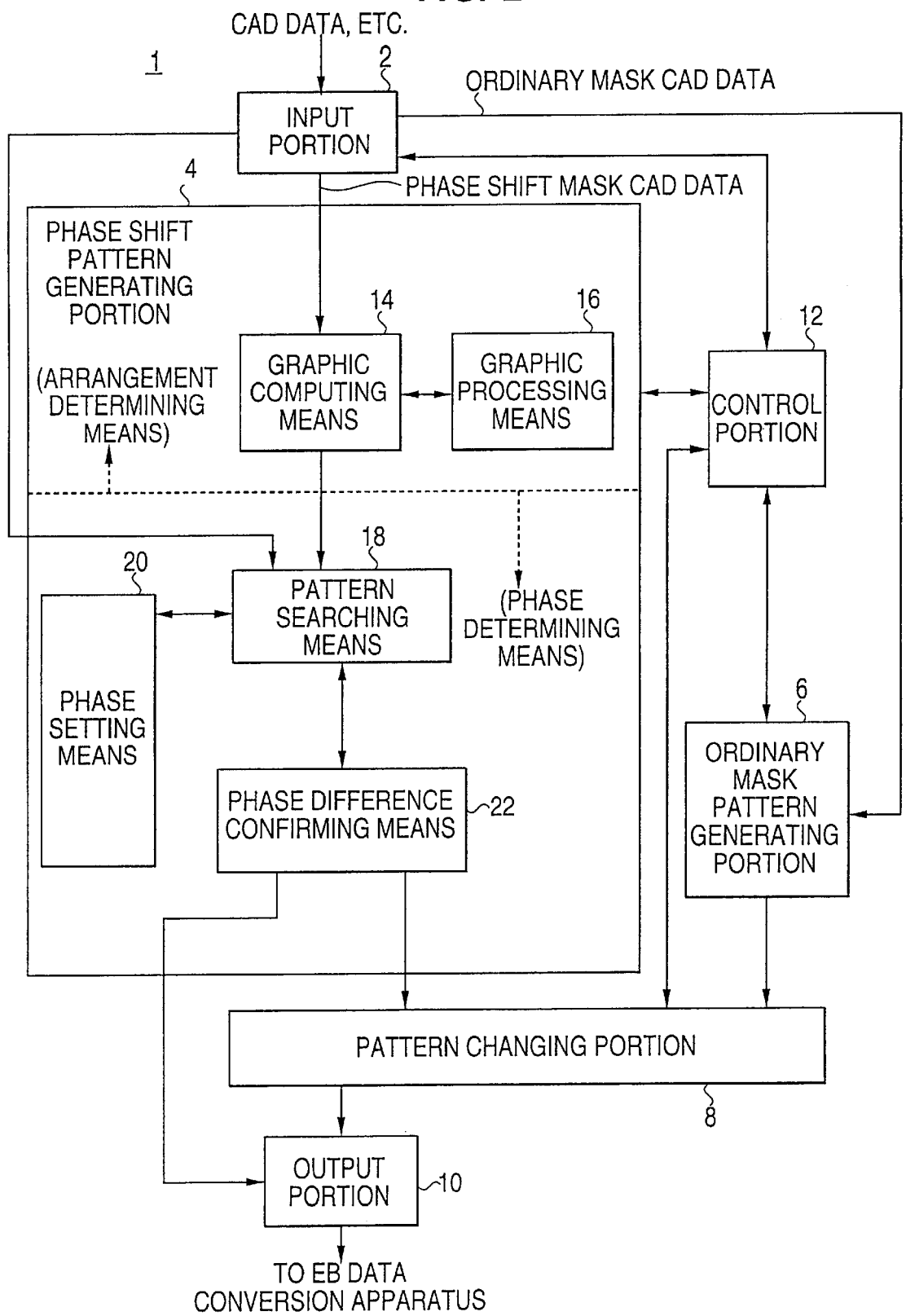

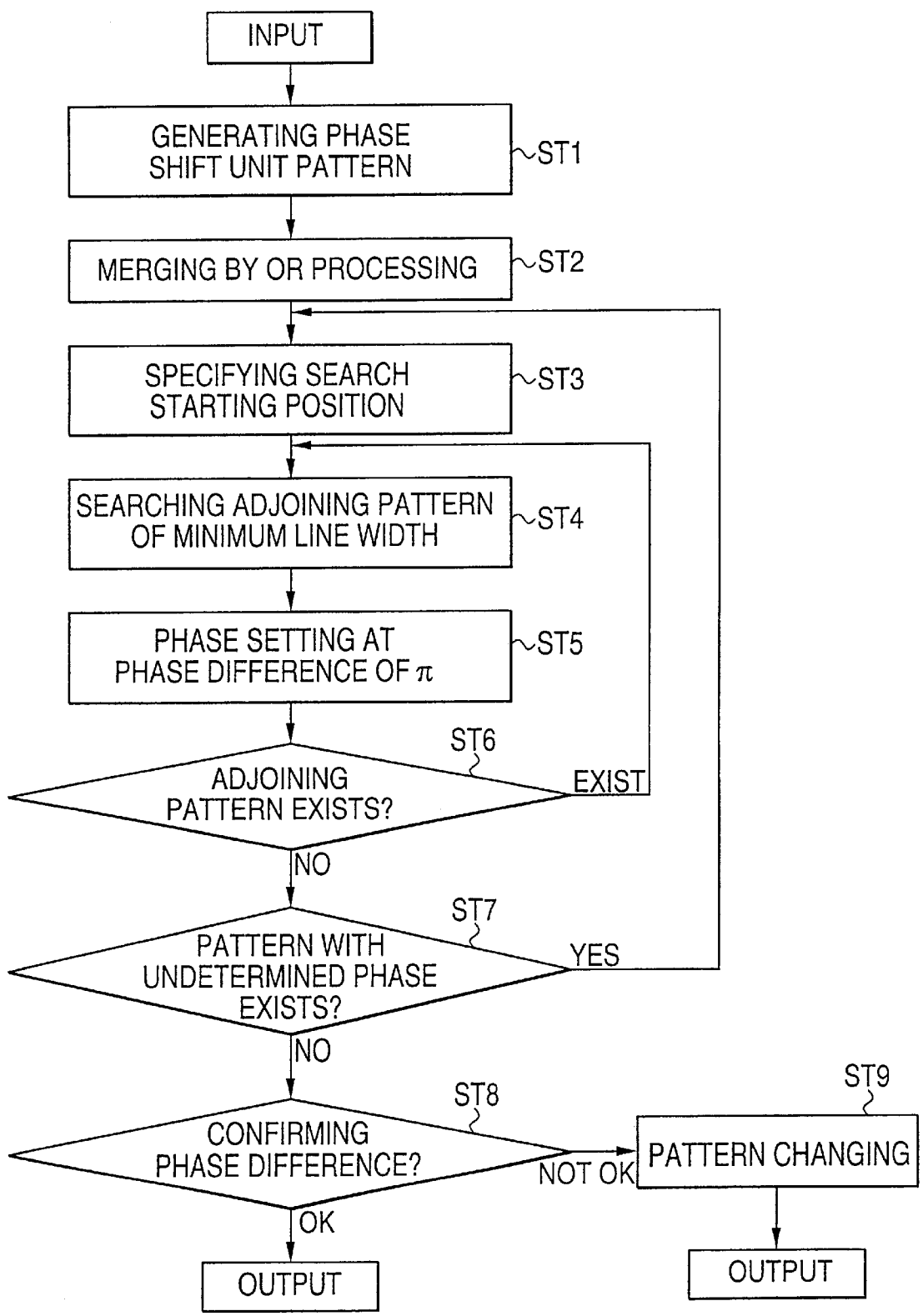

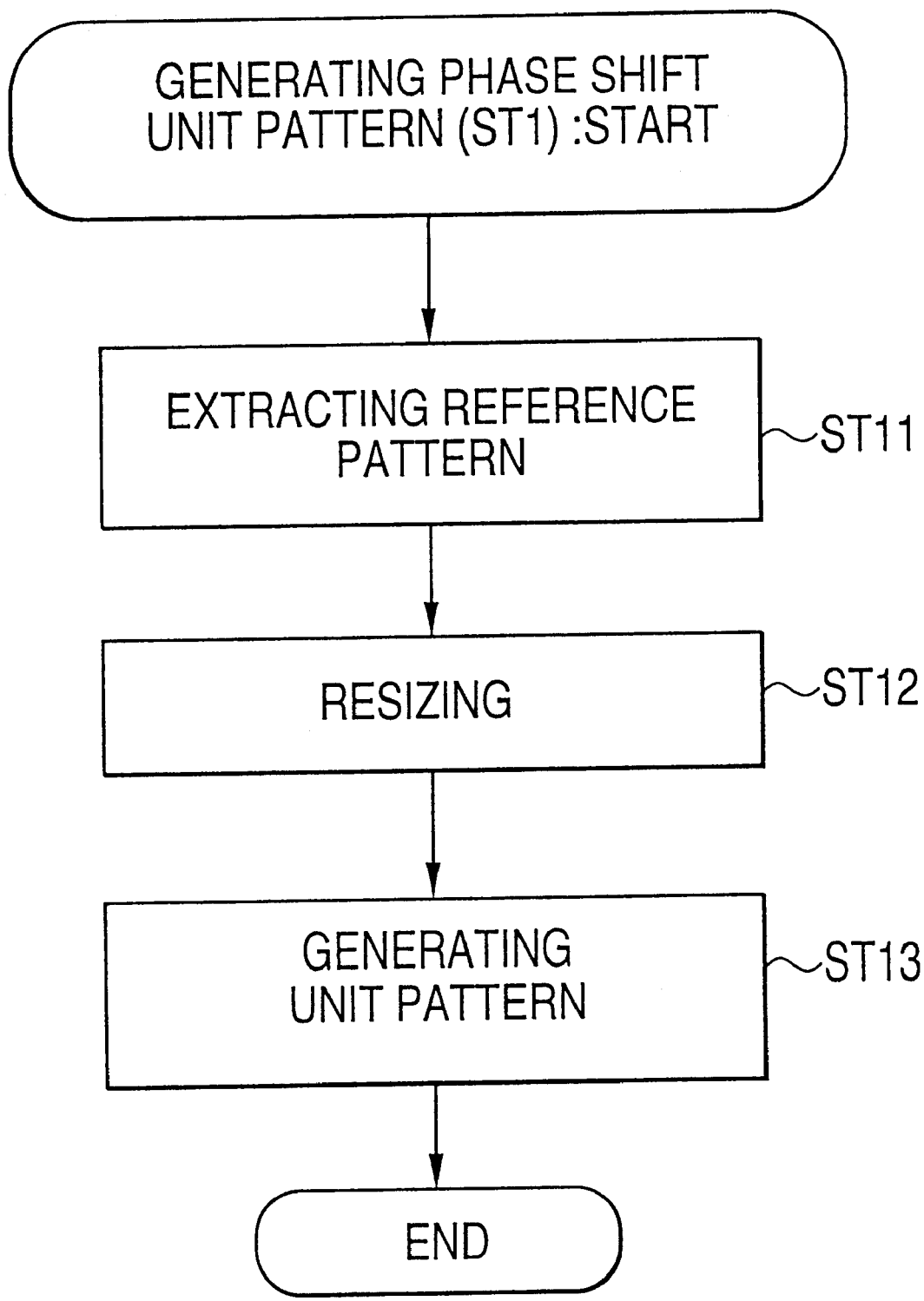

Pa GATE PATTERN

Pb ELEMENT REGION PATTERN

Pa

Pb
Pc AND REGION (FINE GATE PORTION)

Pc FINE GATE PORTION

Pd

Pe FINE GATE (FINE PATTERN) AFTER CHANGING SIZE (Lg < Lg' < Lgo)

Pf UNIT PATTERN

Pf   Pe FINE PATTERN

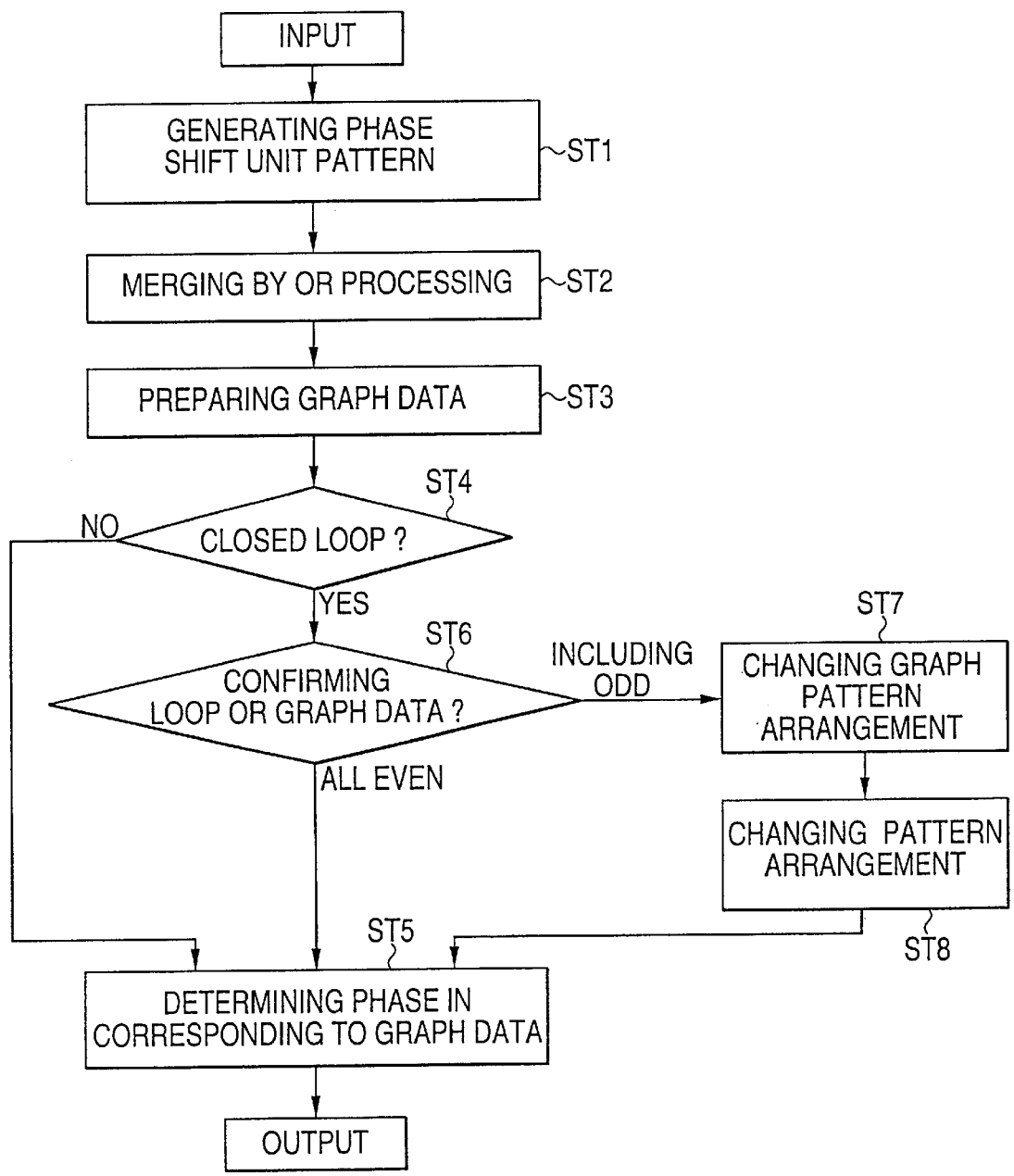

NODE

EDGE

PATTERN EDGE LIST
FOR EACH NODE

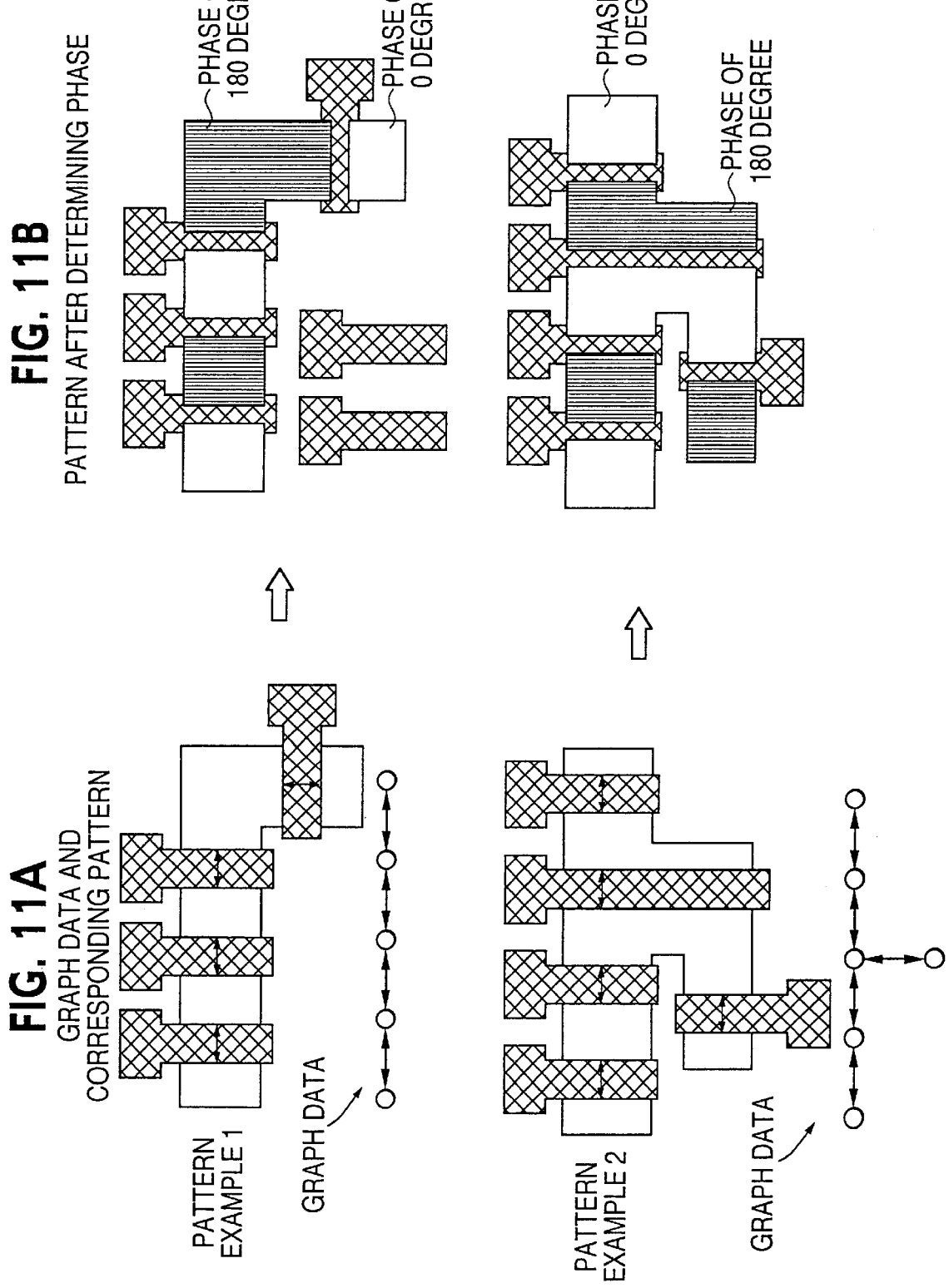

EVEN - NUMBER LOOP

AFTER CHANGING PATTERN

ODD - NUMBER LOOP

SPARSE PATTERN
PHASE SHIFTER OF 180 DEGREE
ELEMENT REGION 1
GATE ELECTRODE
GATE ELECTRODE
ELEMENT REGION 2
PHASE SHIFTER OF 180 DEGREE
DENSE PATTERN

GATE FINE LINE WIDTH OF LIGHT TRANSFER IMAGE (nm)

FOCUS DEPTH (μm)

◇ SPARSE PATTERN
□ DENSE PATTERN

EXTRACTING FINE GATE PATTERN

RESIZING

LIGHT BLOCKING PATTERN

PARTIAL INCREASE OF WIDTH OF LIGHT BLOCKING PATTERN

LIGHT BLOCKING PATTERN AFTER CHANGE

RELATIONSHIP WIDTH PHASE SHIFT

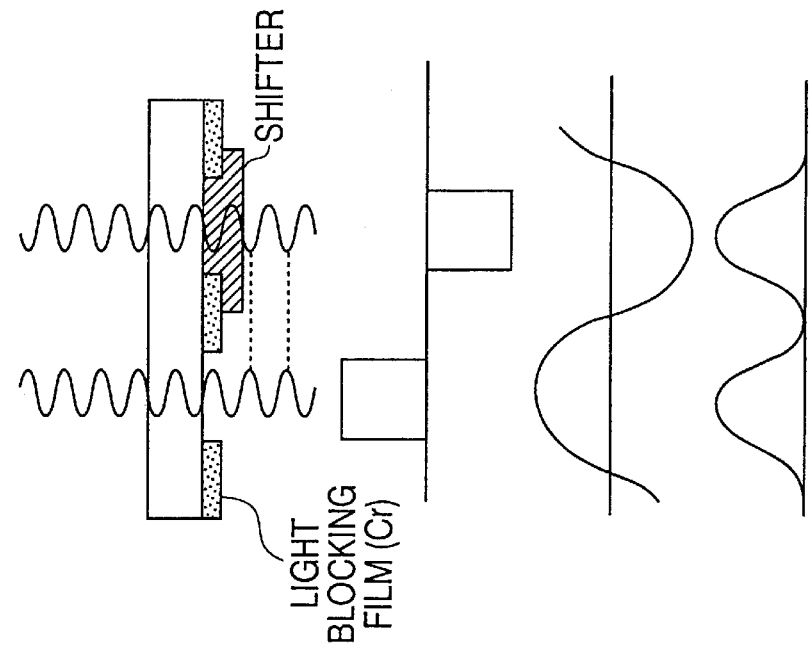
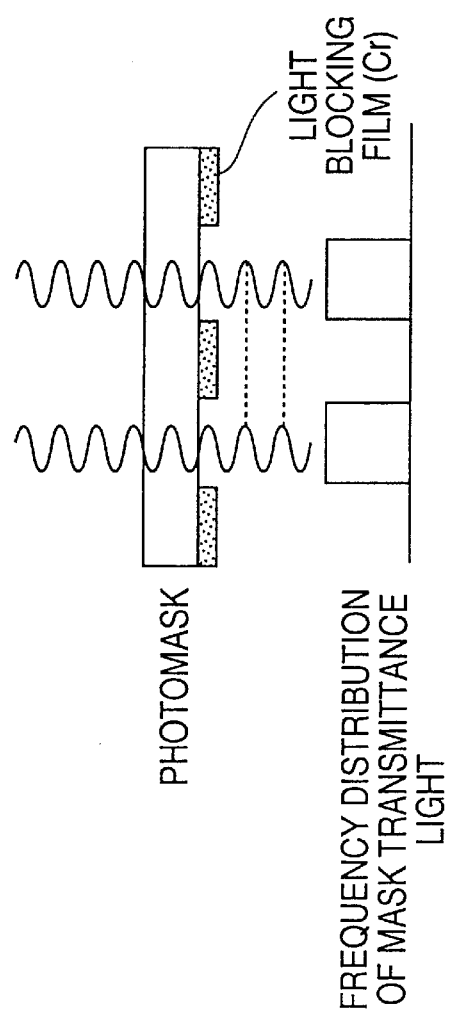
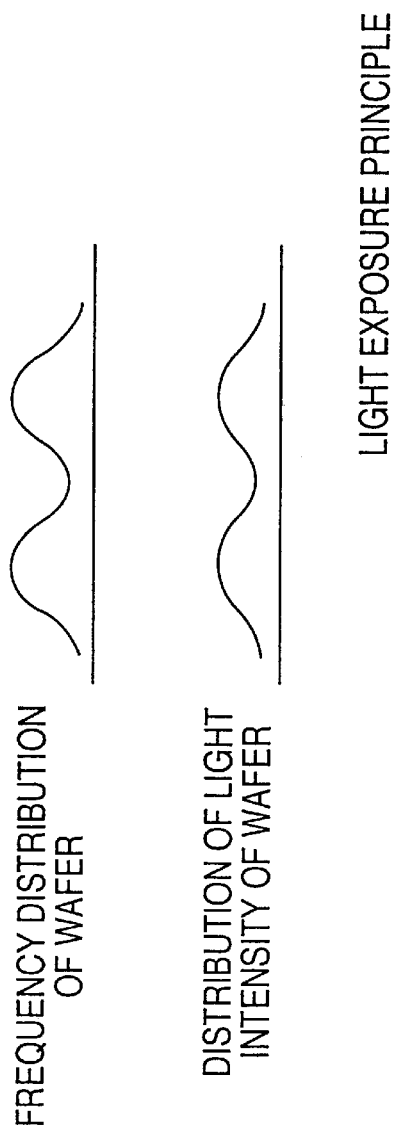

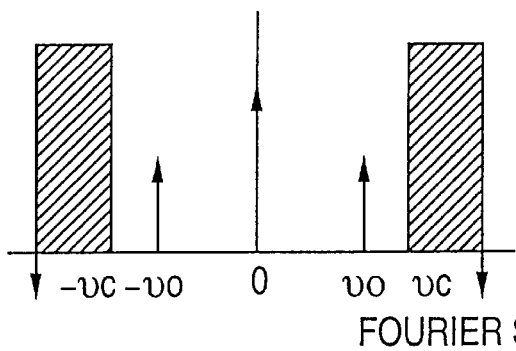
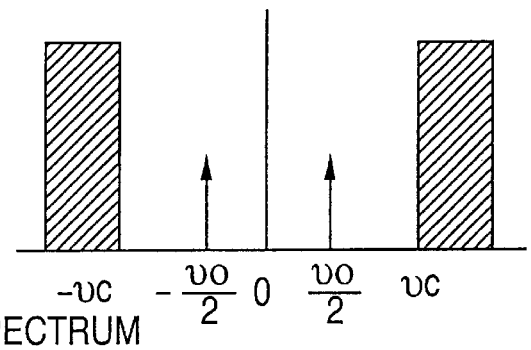
FIG. 17A
CONVENTIONAL METHOD
FIG. 17B
PHASE SHIFT METHOD
FOURIER SPECTRUM

<PHOTOMASK FOR LEVENSON TYPE PHASE SHIFT USING NEGATIVE RESIST>

LIGHT EXPOSURE MASK FOR PHASE SHIFT

<PHOTOMASK FOR LEVENSON TYPE PHASE SHIFT USING POSITIVE RESIST EXPOSED FOR TWO TIMES>

ORDINARY LIGHT EXPOSURE MASK

CROSS - SECTIONAL VIEW

PATTERN GENERATING METHOD AND APPARATUS

BACKGROUND OF THE INVENTION

1. Field of the Invention

The present invention relates to a mask pattern generating method and pattern generating apparatus suitable when desiring to form fine patterns on a wafer substrate at a high resolution from a transmittance light of a photo mask using an exposure device in the process of manufacturing a highly integrated semiconductor device etc.

2. Description of the Related Art

The photo masks used in the process of manufacturing semiconductor devices are comprised of a light blocking film formed on a glass substrate. In a pattern forming process of semiconductor elements, the light blocking pattern on the photo mask is projected on a photo resist coated on the wafer surface and then exposed. The light blocking pattern on the photo mask is obtained by converting designed CAD data to drawing apparatus data and faithfully patterning it. The photo mask pattern is precisely transferred onto the wafer by a semiconductor photolithographic process.

In the photolithographic process in the process of manufacturing a semiconductor device, a high resolution beyond the resolution limit determined by the wavelength of the light is required because it is necessary to form the pattern close to an exposure wavelength. Accordingly, the phase shift method has recently been used as a lithographic technique which can form finer patterns than the exposure wavelength.

Below, the principle of a spatial frequency modulation type phase shift method will be explained.

FIGS. 16A and 16B are views of the principle of the phase shift method compared with a method of the prior art, and FIGS. 17A and 17B are views of Fourier spectrum of the phase shift method and the method of the prior art.

Here, assume that a period of light intensity transmittance is close to the resolution limit of a one-dimensional period pattern having $1/v_0$. Since the light transmitting object is the mask pattern whose size is close to the resolution limit, when considering only the sinusoidal basic frequency component, the amplitude of the light passing through the photo mask can be approximated as follows:

Mask of the related art:

$$T(x)=|\cos 2\pi v_0 x| \tag{1-1}$$

Phase shift mask:

$$T(x)=\cos 2\pi v_0 x \tag{1-2}$$

In the method of the related art shown in FIG. 16A, the light passing through the photo mask was divided into a 0-order diffracted light proceeding straight along the light axis and a ±1st-order diffracted light having an angle of θ (sin $\theta = v_0 \lambda$) with respect to the light axis and strikes a projection lens. On the other hand, as shown in FIG. 16B, in the phase shift method, the light passing through the phase shift mask is separated into a ±1st-order diffracted light having an angle of θ/2 with respect to the light axis and strikes the projection lens. In both cases, only the refracted light passing through the inside of the projection lens contributes to form an image.

The Fourier spectrum formed on an iris plane of the projection lens is expressed as follows from the Fourier transform of the formulas 1-1 and 1-2.

Mask of the related art:

$$F(v)=(4/\pi)\{\delta(v)/2+[\delta(v+v_0)]+\delta(v-v_0)]/2+ \ldots \} \tag{2-1}$$

Phase shift mask:

$$F(v)=(\tfrac{1}{2})[\delta(v+v_0/2)+\delta(v-v_0/2)] \tag{2-2}$$

As shown in FIGS. 17A and 17B, in a transmittance type mask of the related art not considering phases, there are spectrum components at $v=0$ and $\pm v_0$, while in a phase shift mask, this depend only on $v=\pm v_0/2$. Namely, the basic spectrum obtained from the phase shift mask lies at a position of half of the spectrum obtained by the transmittance type mask. This is equivalent to the spatial frequency of the mask pattern becoming half. The projection lens of a stepper acts as a low-pass filter for transferring only the spatial frequency component smaller than a proper frequency (Eigen frequency) vc ($=NA/\lambda$). When considering a case where the spatial frequency $v_0$ of a not transferred fine pattern is vc<$v_0 \leq 284$ c, in the case of a transmittance type mask, the spectrum component of $\pm v_0$ does not pass, so no contrast of the image can be obtained. On the other hand, a phase shift mask transfers the basic spectrum $v=\pm v_0/2$ so forms a pattern image on the image plane. This is the characteristic of a spatial frequency modulation type phase shift mask which has the largest effect of improving the resolution.

The basic layout structure of the spatial frequency modulation type phase shift mask uses, as shown in FIG. 16B, two phases of 0 degree and 180 degrees and arranges shifters in order that apertures of the mask alternately become inverse in phase. As a shifter, as shown in FIG. 16B, there are shifters stacked on films different from the light blocking film and shifters formed by etching a glass surface to impart a shifter function.

This shifter arrangement corresponds to a two-color problem of coloring a flat map by two colors. The shifter phases have to be arranged alternately. Therefore, in a complicated interconnection layout, in principal it is impossible to avoid an arrangement discrepancy (phase mismatch) where the shifter phases cannot be alternately inverted.

As a first prior art, Ohi et al. in the article "Method of Design of Phase-Shifting Mask Utilizing Compactor", JJAP, Vol. 33 (1994), No. 12B, pp. 6774–6778, discusses a technique for avoiding phase mismatch using layout compression (compaction) in a phase shift method using the phase difference of transmittance light between patterns formed.

FIG. 18 is a view of the principle of a so-called Levenson type phase shift utilizing a negative resist—a premise of the first prior art.

In the photo mask shown in FIG. 18, chrome apertures provided at the pattern forming locations are alternately arranged with shifters (glass etching trenches) of a 180-degree phase and without trenches of a 0-degree phase. Accordingly, in this phase shift method, since the phase difference of the light passing through the pattern itself is utilized, a negative resist in which the pattern transferring locations remain without being dissolved in the developing solution is necessary. In addition to the fact that obtaining a practical negative resist is difficult, it is necessary that the pattern layout itself be a pattern which generates a phase difference. Therefore, while this is effective with simple lines and spaces, there is no phase shift effect with an isolated pattern. Accordingly, in the first prior art, even though it is possible to avoid a phase mismatch, there is the disadvantage that there are many constraints in the predicted resist materials and pattern preparation.

Therefore, in recent years, studies have been made on a technique based on multiple exposures including phase shift exposures by a mask giving a phase difference to the light passing through the two sides of the fine patterns to be formed and ordinary exposures for removing the unnecessary patterns generated due to the same (hereinafter referred to as the phase shift multiple exposure method). This second prior art is discussed by Tamechika et al. in the article "Automatic Generation of Phase-Shifting Mask Patterns Using Shifter-Edge Lines", MICRO-AND-NANO-ENGINEERING '97".

FIGS. 19A and 19B are views of the principle of a Levenson type phase shift utilizing a negative resist in the phase shift multiple exposure method.

In the phase shift mask shown in FIG. 19A, apertures provided at the sides of fine patterns (chrome patterns) are alternately formed with shifters of 180-degree phase (glass etching trenches) and without trenches of 0-degree phase. The peripheries are covered with chrome because a positive resist is used. In the second exposure (ordinary exposure), not illustrated peripheral interconnection portions are image-developed while light is blocked from the fine patterns by using a photo mask shown in FIG. 19B.

In the second prior art using the phase shift multiple exposure method, the design layout pattern is restricted to be always parallel. However, actual layout design patterns are not necessarily like that. The patterns of devices which can be prepared by this method are therefore limited.

Also, in the second prior art, due in part to the fact that the shifters are arranged based on the premise of a fixed mask layout pattern, there are locations where phase discrepancies occur. For correction, it is necessary to return once again to the cell design stage to correct them manually. In this way, in the design of a phase shift mask, with the method of determining the arrangement of shifters after the preparation of the layout, when there is a discrepancy in the layout, if a designer intervenes and corrects the contradictory location, many procedure steps are required for the arrangement of shifters and determination of the phases and the design efficiency becomes extremely poor.

Furthermore, with fine patterns formed by phase shift patterns, the rough and fine degree due to the distances between the patterns sometimes cause variations in the line width of the patterns formed. In order to reduce this, changing the line widths of the fine patterns in accordance with the distance between patterns has been studied in the past. In patterns so fine that as to reach the limits of control in the manufacturing process of a photo mask, however, the result of the correction would be outside the limit of the line width in the manufacturing process of the photo mask and there is a possibility that photo mask could not be produced.

SUMMARY OF THE INVENTION

An object of the present invention is to provide a method and apparatus for generating mask patterns suitable for multiple exposures which enables automatic arrangement of shifters without any discrepancies and can tremendously improve the design efficiency in the design of phase shift masks and which corrects the dependency of line width on rough and fine degree due to the distances between the patterns of the fine processing patterns utilizing a phase shift.

The present inventor engaged in intensive studies to solve the above disadvantages of the prior art. As a result, in the method of layout of a spatial frequency modulation type phase shift mask pattern, as a pattern generating method suitable for the phase shift multiple exposure method forming only locations where control of the line width is difficult by phase shift and exposing the remaining portions by an ordinary mask, he newly proposed the technique of arranging the phase shifters so as to be able to form the two adjacent portions of the portions where control of the line width is difficult by transmittance light of different phase differences and discovered that this enabled automation of the generation of phase shift patterns and determination of the phases and enabled higher speed processing even in changes of patterns for eliminating locations of phase discrepancies.

Namely, to solve the above disadvantages of the prior art and to attain the above object, the pattern generating method of the present invention provides a pattern generating method for a mask pattern including a plurality of fine patterns and a plurality of phase shift patterns arranged at the two sides of said fine patterns in a direction of fine line width to eliminate light interference due to a phase difference of light passing through, wherein shapes and phases of the plurality of phase shift patterns are determined based on positional relationships of the plurality of fine patterns and the phases are determined to give a phase difference of 180 degrees at the two sides of said fine patterns.

Preferably, when there is a phase mismatch giving a phase difference of 0 degree, the pattern is changed to eliminate the phase mismatch.

Preferably, the shapes and phases of the phase shift patterns are determined by the following routine.

First, the plurality of fine patterns are extracted from already designed element shape patterns. Unit patterns of at least a predetermined width required for canceling the light interference are arranged at the two sides of each of the extracted plurality of the fine patterns in the direction of fine line width (for example, so that no clearance can be formed at the opposite sides of the fine patterns while changing the width in the direction of fine line width). Further, the plurality of phase shift patterns are generated using the unit patterns (for example, by obtaining the graphical OR's of the arranged unit patterns).

Further, the phases are determined while searching for adjoining phase shift patterns straddling the fine patterns so that phase differences between adjoining phase shift patterns successively become 180 degrees.

In this pattern forming method, the shapes and phases of the phase shift patterns are not determined at the stage of designing the patterns (element shape patterns) which determines the actual element shapes. The shapes and phases of the phase shift patterns are determined based on the positional relationships of the plurality of fine patterns to be formed by high resolution by phase shift.

For example, the fine pattern locations are extracted from the parts of the element shape patterns other than the phase shift patterns and the phase shift patterns are arranged at predetermined widths giving at least a phase shift effect at the two sides in the direction of fine line width to determine the shapes. The phases of the phase shift patterns are successively determined. For example, any fine pattern is taken note of and the phases of the phase shift patterns around the noted pattern are determined so that the surrounding phases differ by 180 degrees. Next, another fine pattern sharing a pattern for which the phase is determined is taken note of and the phase of the remaining phase shift pattern is determined to differ by 180 degrees. The phases are successively continuously determined so as to determine the phases of all of the phase shift patterns.

When a phase mismatch giving unchanged phases of the two sides of a fine pattern arises at the final stage of the phase determination, the phase mismatch is eliminated by changing the pattern.

For example, the design rule is changed to compress (or expand) the entire pattern layout. At this time, if a constraint such as for example not to apply compression to phase mismatch locations etc. is given in advance, along with the design rule of the surrounding patterns and alignment margin etc. becoming smaller, the required width of the phase shift patterns becomes smaller. On the other hand, since the locations of the phase shift patterns on which constraints are placed are not compressed in size, a margin of space is generated. As a result, it becomes possible, for example, to divide a phase shift pattern by 2 to a phase difference π and therefore possible to eliminate the phase mismatch. Also, the methods of searching for a phase shift pattern able to be divided by 2 to change the pattern and of securing a space able to be divided by 2 by separating the fine patterns can be adopted. Of course, when the location where a phase mismatch occurs is not a fine pattern, the phase mismatch may be left as it is.

Also, the relationship between the phase pattern locations and the adjoining phase patterns is handled as graph data. This graph data is used as the basic data for automatically determining the remaining phases when the phase of one location is determined. Accordingly, it is easy to determine a phase for a phase shift pattern which is linked by the graph even without actually searching for the pattern. Also, the existence of a phase mismatch can be detected instantaneously in advance and therefore higher speed processing becomes easy. Further, even when changing a pattern, corrections can be made on the graph and the data used to assist actual changes in the pattern and therefore pattern changes can be facilitated.

On the other hand, the pattern forming method of the present invention for easing the rough and fine degree of the line width in the phase shift multiple exposure method is a pattern generating method for generating a mask pattern used when forming a single layer by a plurality of exposures including high resolution exposure using a plurality of fine patterns and a plurality of phase shift patterns arranged at the two sides of the fine patterns in the direction of fine line width for canceling light interference due to a phase difference of passing light and ordinary exposure for locations other than the fine patterns, wherein when generating a mask pattern used for said ordinary exposure, a size of a light blocking pattern on said mask for ordinary exposure superposed at a position corresponding to a said fine pattern on said mask for high resolution exposure is changed in a direction reducing a line width difference after image-development caused by the density of said fine patterns.

The easing of the line width difference due to the rough and fine degree of the fine patterns was limited with correction only on the phase shift mask of the related art, but in this pattern generating method, it is possible to reduce or correct the line width difference after image-development caused by the rough and fine degree of the fine patterns in the second and later ordinary exposures. Generally, the fine patterns of the phase shift masks are already made fine to the limit of manufacture of a photo mask, however, in the masks for the second and later ordinary exposures, there is often a margin for change of the size. In this method, it is possible to reduce or correct the difference in line width between the fine patterns while avoiding constraints derived from the limits of manufacture of the photo mask.

The pattern generating apparatus of the present invention includes, as means for working the pattern generating method of the present invention explained above, an arrangement determining means for determining positions and shapes of said plurality of phase shift patterns based on positional relationships of said plurality of fine patterns and a phase determining means for determining phases of said plurality of phase shift patterns based on positional relationships of said plurality of fine patterns and so that a phase difference at the two sides of said fine shift patterns becomes 180 degrees. Further, preferably, it has a pattern changing means for changing a pattern to cancel said phase mismatch when a phase mismatch occurs resulting in a phase difference of 0 degree.

BRIEF DESCRIPTION OF THE DRAWINGS

These and other objects and features of the present invention will become clearer from the following description of the preferred embodiments given with reference to the accompanying drawings, in which:

FIG. 1 is a cross-sectional structure view of a general MOS integrated circuit;

FIG. 2 is a block diagram of an example of the schematic configuration of a pattern generating apparatus according to a first embodiment of the present invention;

FIG. 3 is a flow chart of a pattern generating method according to the first embodiment of the present invention;

FIG. 4 is a flow chart of an example of a routine of the unit pattern generating process in FIG. 3;

FIG. 9 is a flow chart of a pattern generating method according to the second embodiment of the present invention;

FIGS. 11A and 11B are views of a pattern and graph of two examples where there is no closed loop;

FIGS. 16A and 16B are views of the principle of the phase shift method in comparison with a method of the related art;

FIGS. 17A and 17B are views of the Fourier spectrum of transmittance light in the phase shift method and the method of the related art;

DESCRIPTION OF THE PREFERRED EMBODIMENTS

Figure 5A:
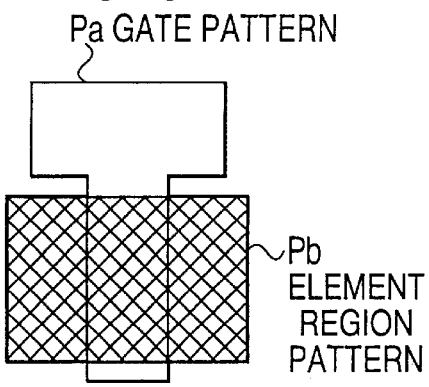
FIGS. 5A to 5F are pattern diagrams of a process for generating a unit pattern taking as an example a MOS integrated circuit.

Below, preferred embodiments will be described with reference to the accompanying drawings.

The present invention relates to a method and apparatus for forming fine patterns below the resolution limit using a spatial frequency modulation type phase shift method. There is no limit on the types of fine patterns, however, as a representative pattern desired to be made below the resolution limit in current semiconductor devices, mention may be made of the gate pattern of a MOS transistor.

Below, an explanation will be made of the structure of a MOS transistor, then a detailed explanation will be made of embodiments of a pattern generating method and apparatus according to the present invention with reference to the drawings taking as an example the super high resolution exposure of a gate pattern.

FIG. 1 is a cross-sectional view of the structure of a general MOS integrated circuit.

In FIG. 1, reference numeral 100 represents a MOS integrated circuit, 101 a semiconductor substrate such as a p-type silicon wafer, 102 source and drain impurity regions in which an n-type impurity is doped at a high concentration, 104 a channel stopper in which a p-type impurity etc. is doped at a high concentration for preventing formation of a parasitic transistor, 106 a LOCOS as an element isolation layer, 108 a gate oxide film, and 110 a gate electrode made of n-type polycrystalline silicon etc.

In such a MOS integrated circuit, the highest controllability of the line width is required when processing the gate electrode 110. Namely, the gate pattern width of a transistor (in general, the gate length Lg) determines the transistor characteristics (gate threshold voltage Vth, mutual conductance gm, and other drivability). Variations in the line width directly affect variations in characteristics, so control of the line width of the gate electrode pattern is the most important in the formation of a MOS transistor.

First Embodiment

FIG. 2 is a block diagram of an example of the schematic configuration of a pattern generating apparatus according to a first embodiment.

A pattern generating apparatus 1 of the illustrated example is roughly divided into an input portion 2, a phase shift pattern generating portion 4, an ordinary mask pattern generating portion 6, a pattern changing portion 8, an output portion 10, and a control portion 12.

The phase shift pattern generating portion 4 further comprises a graphic computing means 14, graphic processing means 16, pattern searching means 18, phase setting means 20, and phase difference confirming means 22. Among these, the graphic computing means 14 and graphic processing means 16 correspond to the "arrangement determining means" of the present invention, while the pattern searching means 18, phase setting means 20, and phase difference confirming means 22 correspond to the "phase determining means" of the present invention. The graphic computing means 14 corresponds to the "pattern extracting means" or "pattern synthesizing means" in the present invention, while the graphic processing means 16 corresponds to the "unit pattern generating means" in the present invention.

The functions of these components will be described in the following explanation of the routine. But roughly speaking, the arrangement determining means of the present invention comprising for example the two means 14 and 16 determines the shapes of the plurality of phase shift patterns arranged at the two sides of a plurality of fine patterns in the direction of fine line width based on positional relationships of the plurality of fine patterns.

Also, the phase determining means of the present invention comprising for example the three means 18, 20, and 22 determines the phases of the plurality of phase shift patterns based on the positional relationships of the plurality of fine patterns and so as to give a phase difference of 180 degrees between pairs of adjoining phase shift patterns standing the fine patterns.

Figure 19A:
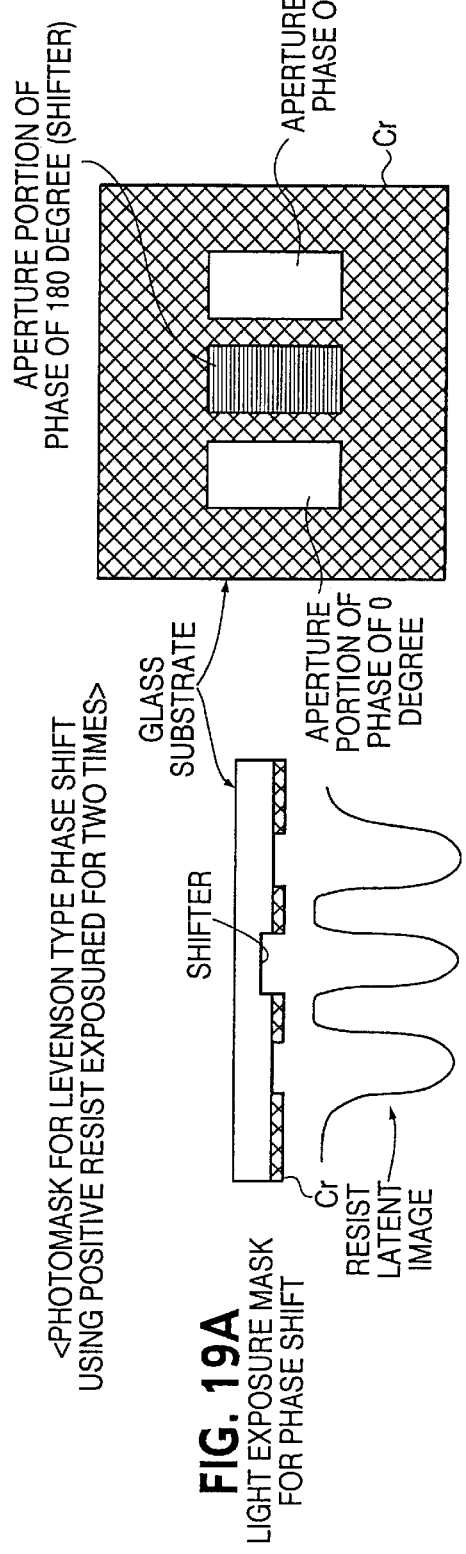
FIGS. 19A and 19B are views of the principle of a Levenson type phase shift using as positive resist as a phase shift multiple exposure method of a second prior art.
Figure 19B:
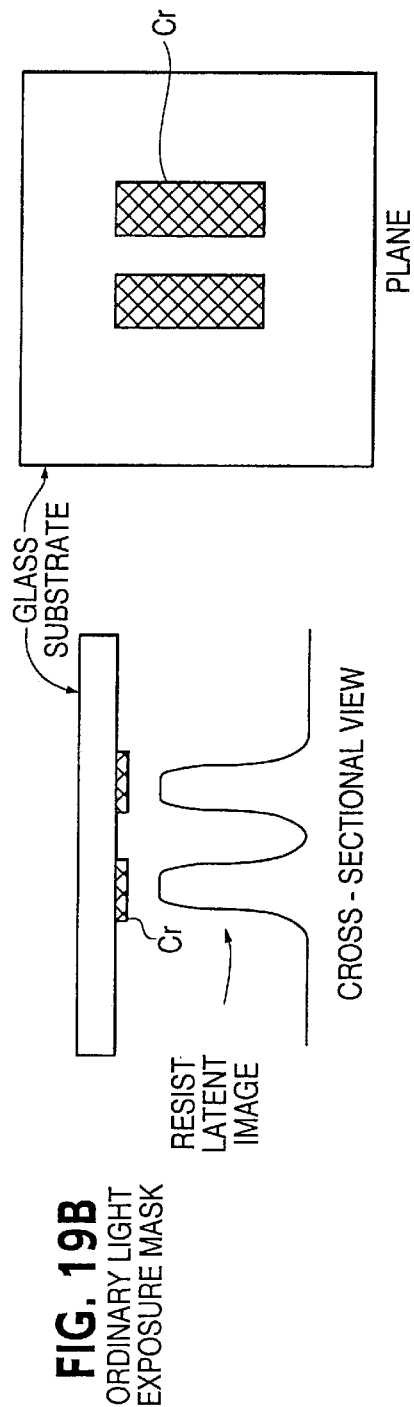

In the present example, a "fine pattern" is a light blocking pattern forming a gate electrode 110 of FIG. 1. Apertures of a light blocking pattern arranged at the two sides of the light blocking pattern in the direction of gate length with a phase difference of 180 degrees (180-degree phase aperture and 0-degree phase aperture of FIGS. 19A and 19B) correspond to the "phase shift patterns".

Next, an embodiment of the pattern generating method will be explained using a flow chart of FIG. 3. The generating method can be carried out by, for example, the pattern generating apparatus 1 shown in FIG. 2. Here, suppose that the means carry out processing under the control of the control portion 12 in the pattern generating apparatus 1.

At step 1 of FIG. 3, a unit pattern is generated which has a sufficient width so that the diffracted lights passing through the two sides of the gate electrode pattern cancel each other out and serves as a component of the phase shift pattern found.

FIG. 4 is a flow chart of an example of a routine for generating a unit pattern. Also, FIGS. 5A to 5F are plan views of a pattern showing the process for generating a unit pattern in a MOS integrated circuit of the present example.

In the method illustrated in FIG. 4, first the input portion 2 of FIG. 2 inputs CAD data, then at step ST11, a fine pattern is extracted from the CAD data. The fine pattern becomes a reference for determining a position and a length (size orthogonal to the fine line width image-developed) of unit pattern generation. The fine pattern is extracted by the graphic computing means 14 of FIG. 2 based on the CAD data from the input portion 2.

Figure 5B:
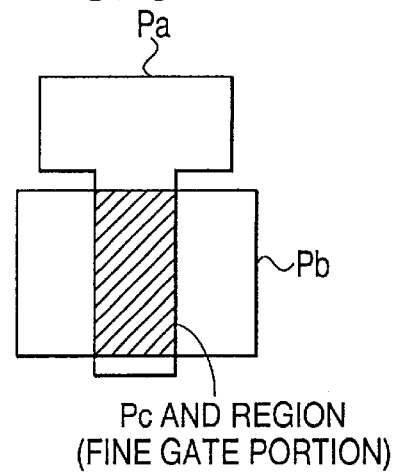
Figure 5C:
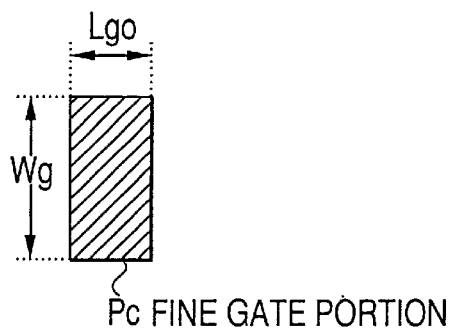

Specifically, the locations having a fine line width, which determine the transistor characteristics the MOS integrated circuit of the present example, are the overlapping portions of the gate polycrystalline silicon layer and the element regions other than the LOCOS regions. Therefore, first, as shown in FIG. 5A, a gate pattern Pa and an element region pattern Pb are read. Then, as shown in FIG. 5B, the element shape patterns read from the CAD data are superposed and processing for the product of the graphics (AND processing) is performed to extract the fine gate portion Pc (FIG. 5C).

Figure 5D:
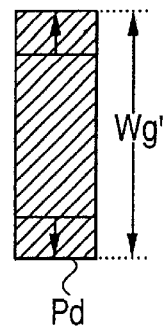
Figure 5E:
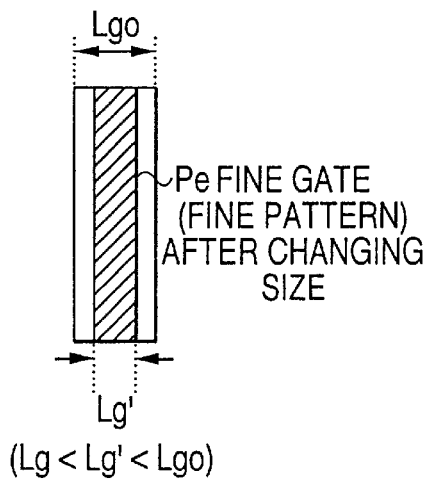

Next, at step ST12 in FIG. 4, resizing is carried out twice on the extracted fine gate portion Pc. This resizing is carried out by the graphic processing means 16 of FIG. 2. Specifically, as shown in FIG. 5D, to secure an alignment margin for multiple exposure, a gate width Wg of the fine gate portion Pc is enlarged by exactly a predetermined length at the two sides in the direction of gate width. Also, as shown in FIG. 5E, resizing is then carried out on the fine gate portion Pd, after enlargement in the direction of gate width, at the two sides in the direction of gate length. As a result, a final fine gate pattern Pe where the original gate length Lg0 is reduced to Lg' is obtained. The resized gate length Lg' becomes one of the parameters which most affect the line width of image-development of the gate pattern.

Figure 5F:
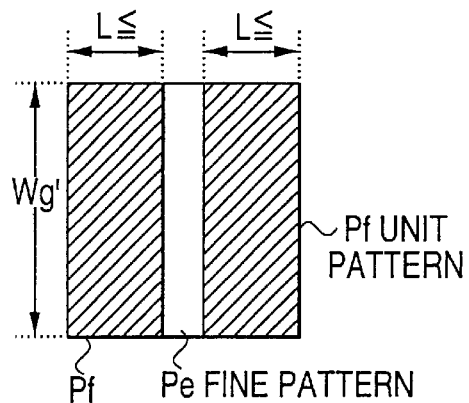

At step ST13 in FIG. 4, the unit patterns constituting the phase shift patterns are generated by using the resized fine gate pattern Pe as a reference. The patterns are generated by the graphic processing means 16 of FIG. 2. Specifically, as shown in FIG. 5F, two unit patterns Pf having a width of at least a predetermined width L sufficient for a phase shift and extending along the entire longitudinal side (length Wg') of the fine gate pattern Pe are generated at the two sides of the fine gate pattern Pe in the direction of fine line width. When the above requirements are fulfilled, the unit pattern Pf may be any shape, but a unit pattern Pf is generated in the rectangular shape shown in FIG. 5F and the process of generation of unit patterns shown in FIG. 4 is completed.

Next, the routine of the processing returns to the flow of FIG. 3. At step ST2, merging is performed by OR processing. This processing is carried out by the graphic computing means 14 of FIG. 2. By this, the desired phase shift patterns can be obtained.

Figure 6:
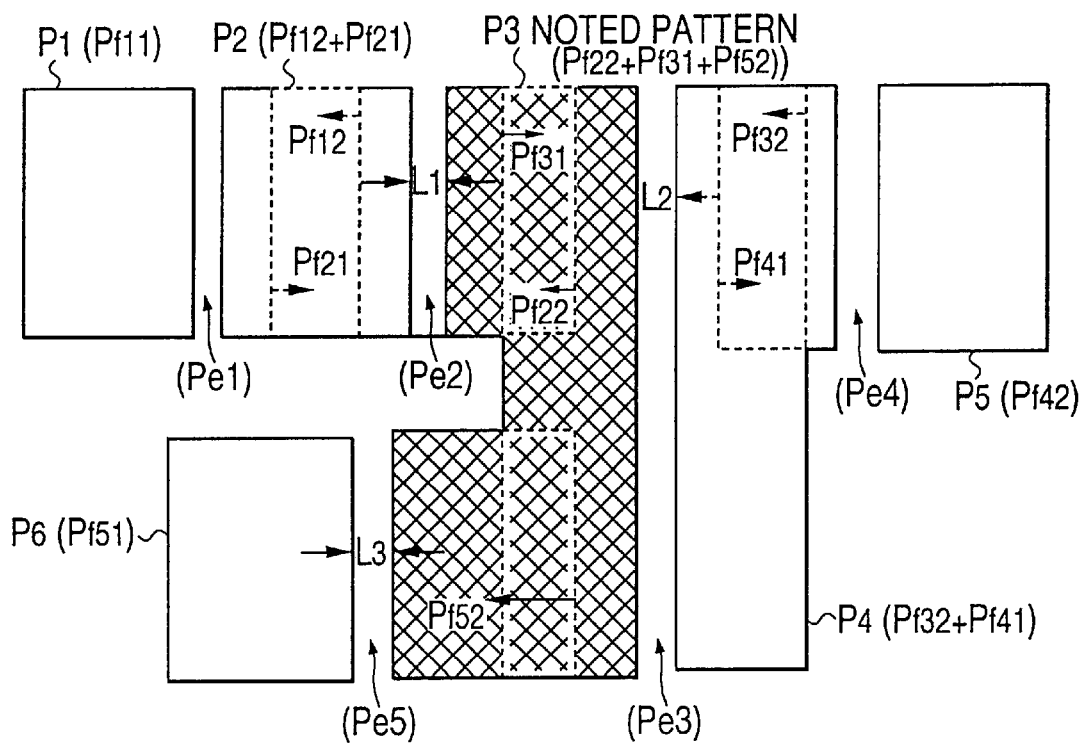
FIG. 6 is a pattern diagram of an example of the obtained phase shift pattern.

One example of the obtained phase shift patterns is shown in FIG. 6. In this illustrated example, phase shift patterns P1, P5, and P6 are constituted by single unit patterns Pf11, Pf42, and Pf51. Phase shift patterns P2 to P4 are constituted by graphical OR's of the plurality of the unit patterns. The phase shift pattern P2 is constituted by a graphical OR of one unit pattern Pf12 of the fine gate pattern Pe1 and another unit pattern Pf21 of the fine gate pattern Pe2. In the same way, the phase shift pattern P4 is constituted by a graphical OR of one unit pattern Pf32 of the fine gate pattern Pe3 and another unit pattern Pf41 of the fine gate pattern Pe4. Also, a phase shift pattern P3 is comprised by a graphical OR of three unit patterns, that is, one unit pattern Pf22 of the fine gate pattern Pe2, another unit pattern Pf31 of the fine gate pattern Pe3, and one unit pattern Pf52 of the fine gate pattern Pe5. In forming these phase shift patterns formed by graphical OR's, the widths of the unit patterns are adjusted so as to prevent minute spaces between unit patterns which become problems in the process of manufacturing a photo mask.

Then, based on the information sent from the input portion 2 of FIG. 2 for example, the pattern searching means 18 determines the initial searching position and its phase (step ST3), then searches for the adjoining pattern of the smallest line width at the next step ST4.

For example, when taking note of the phase shift pattern P3 in the example of FIG. 6, first, using this as the initial searching pattern, it is determined whether to make the phase 0 degree or 180 degrees. Then, the pattern searching means 18 detects L1 to L3 in the predetermined fine line widths adjoining the noted pattern P3, then detects the adjoining patterns P2, P4, and P6 within the fine line widths.

At the next step ST5, the phases of the detected phase shift patterns P2, P4, and P6 are set to a phase difference π with respect to the noted pattern. The phases are set by the phase setting means 20 of FIG. 2. For example, when supposing that the phase of the noted pattern P3 set in advance is made 0 degree, the phases of all of the adjoining patterns P2, P4, and P6 become 180 degrees.

Figure 7:
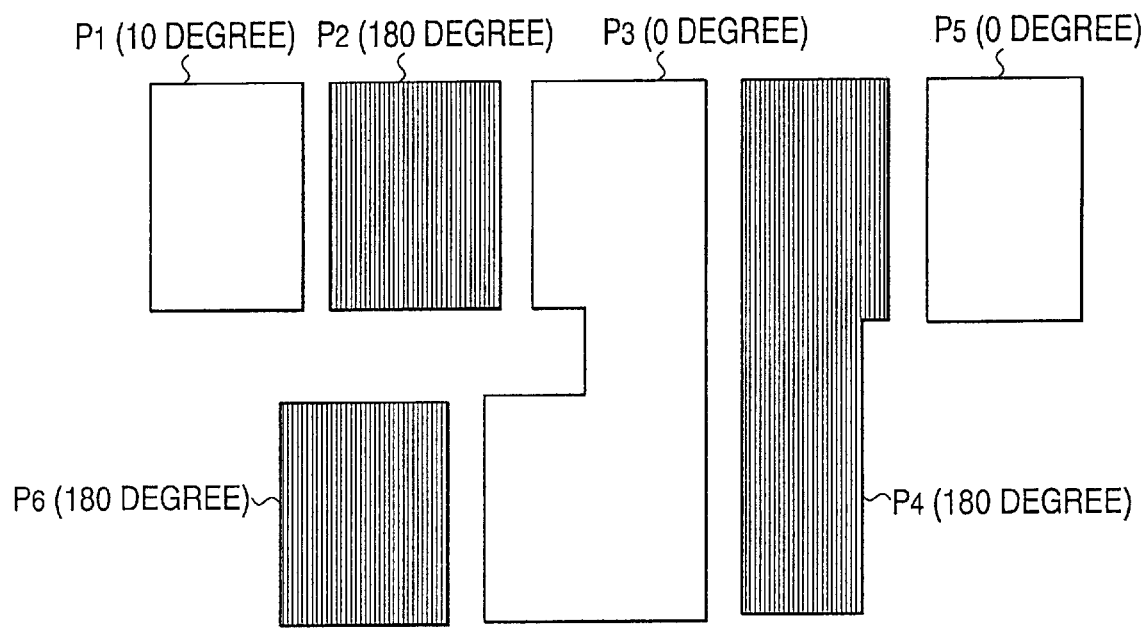
FIG. 7 is a pattern diagram of an example of setting the phase for the pattern in FIG. 6.

At the next step ST6, for example, the pattern searching means 18 of FIG. 2 designates the adjoining pattern whose phase has been determined as the new noted pattern and confirms if there are any further adjoining patterns to the newly noted pattern. When there are adjoining patterns, the flow returns to before step ST4, where the means again detects the adjoining patterns of the new noted pattern (step ST4), determines their phases (step ST5), and confirms the existence of still further adjoining patterns (step ST6). In the example of FIG. 6, the remaining patterns P1 and P5 are searched for by this series of processing, the phases are set to 0 degree, and two types of phase distributions as in FIG. 7 are determined. When it is judged that there are no adjoining patterns, the flow proceeds to the next step ST7.

At step ST7, for example, the phase difference confirming means 22 of FIG. 2 examines whether there are any patterns whose phases have not yet been determined. In the example of FIG. 6, it is judged that there are no patterns with undetermined phases. At the following step ST8, it is examined whether there is a phase difference of 180 degrees at the two sides of the fine gate patterns in the direction of fine line width. When there is no phase mismatch ("OK"), the phase shift patterns and the phase distribution information are output from the output portion 10 of FIG. 2 and sent to the following EB data conversion apparatus.

At step ST7, when there are patterns with undetermined phases, the flow of processing returns to before step ST3 and starts again from resetting the retrieved position. Due to this, phase determination is repeated by the above routine until finally there are no longer any patterns with undetermined phases.

On the other hand, when it is judged that there is a phase mismatch at the next step ST8 ("NOT OK"), the processing proceeds to step ST9.

At step ST9, the phase shift pattern for which elimination of the phase mismatch is targeted is changed. This processing is carried out by the pattern changing portion 8 of FIG. 2.

Specifically, the sizes of the regions of arrangement of the two phase shift patterns of the phase mismatch location are examined to judge whether there is a margin of space for adding (dividing by 2) a phase shift pattern to at least one of them. Namely, the widths of the two phase shift patterns in a direction of gate length are examined to confirm whether the widths are at least twice the minimum required width L for obtaining a phase shift effect. When it is at least twice, the above phase mismatch is eliminated by adding a phase shift pattern having a phase difference π to that location. Note that, although it is not illustrated in the flow chart of FIG. 3, it is possible to detect a location of a large size enabling addition of a pattern in the linked search path where the phase mismatch occurred, eliminate the phase mismatch there, and then reset the phases using the above routine.

If a phase mismatch cannot be eliminated even by such a measure to eliminate the phase mismatch, in the present embodiment, corrections are made between fine gate patterns (layout correction) at the phase mismatch location or at another location having less of an effect on the transistor characteristics etc. when present in the identical linked search path as the phase mismatch location to enable adjoining arrangement of a pair of phase shift patterns having a phase difference π. The layout can be corrected manually and may be corrected automatically using a layout compactor etc. When using a layout compactor, a constraint is added at the above correction location, then for example the constraint of the correction location is reflected into the design rule of the compactor and the entire layout is compressed so as to enable arrangement of two phase shift patterns having a phase difference of 180 degrees at the above correction location. At this time, since the correction location has not been given the constraint of, for example, not being compressed, the design rule of the surrounding patterns and alignment margin etc. becomes small and along with this the size of the required phase shift pattern also becomes smaller, while the location of the phase shifter given the constraint is not compressed in size, so the space necessary for adding a pattern is generated.

Note that in the above explanation, when the location where the phase mismatch occurred was not a fine pattern, the phase mismatch could be left as it is since it is eliminated by the second exposure. Further, of course, the phase mismatch can be eliminated in the same way in the process of expanding the layout as a whole.

Then, when the phase mismatch can be eliminated by adding a phase shift pattern, the result (phase shift pattern and distribution information of the phase after the change) is output from the output portion 10 of FIG. 2 and generation of the phase shift pattern is completed.

In a case where a phase shift pattern is added and a space produced ends up being image-developed, the light blocking pattern in the second ordinary exposure of the multiple exposures is corrected when necessary.

Note that the ordinary mask pattern generating portion 6 of FIG. 2 also generates a protective pattern which is one size larger in consideration of the alignment margin and which is stacked over the fine gate. Details of this are given in the later explained third embodiment, so an explanation will be omitted here.

In the pattern generating method according to the first embodiment, the shapes and phases of the phase shift patterns are not determined in the cell design stage; the shapes and phases of the phase shift patterns are determined successively continuously using the positions and shapes of the fine gate patterns as references. Therefore, when the shape and arrangement of a gate pattern are determined, the phase shift pattern and its phase can be automatically determined and therefore the phase shift patterns can be designed at a high speed.

Especially, since this is done by a search technique linked to the determination of the phases, feedback of the correction (phase change) is easy. For example, when a phase mismatch occurs, in both the case of adding a pattern at a location where there is a margin of space for eliminating the phase mismatch and the case where it is necessary to change the layout to enlarge the intervals of the gate pattern layout, the following confirmation of the phase difference and resetting of the phase are smooth. Further, even when the phase mismatch cannot be eliminated by these methods, the phase mismatch can be eventually eliminated without fail by layout compression or expansion.

Furthermore, since the shapes and phases of the phase shift patterns are found based on the positional relationships of the fine patterns, the phase shift patterns can be adjoiningly arranged with a phase difference of 180 degrees in any direction in a two-dimensional plane. Accordingly, the fine patterns do not have to be parallel and there are fewer constraints than in the prior art.

From the above, the pattern generating method of the present embodiment is advantageous in that there are fewer constraints in pattern generation than the past and the efficiency is high.

Second Embodiment

Figure 8:
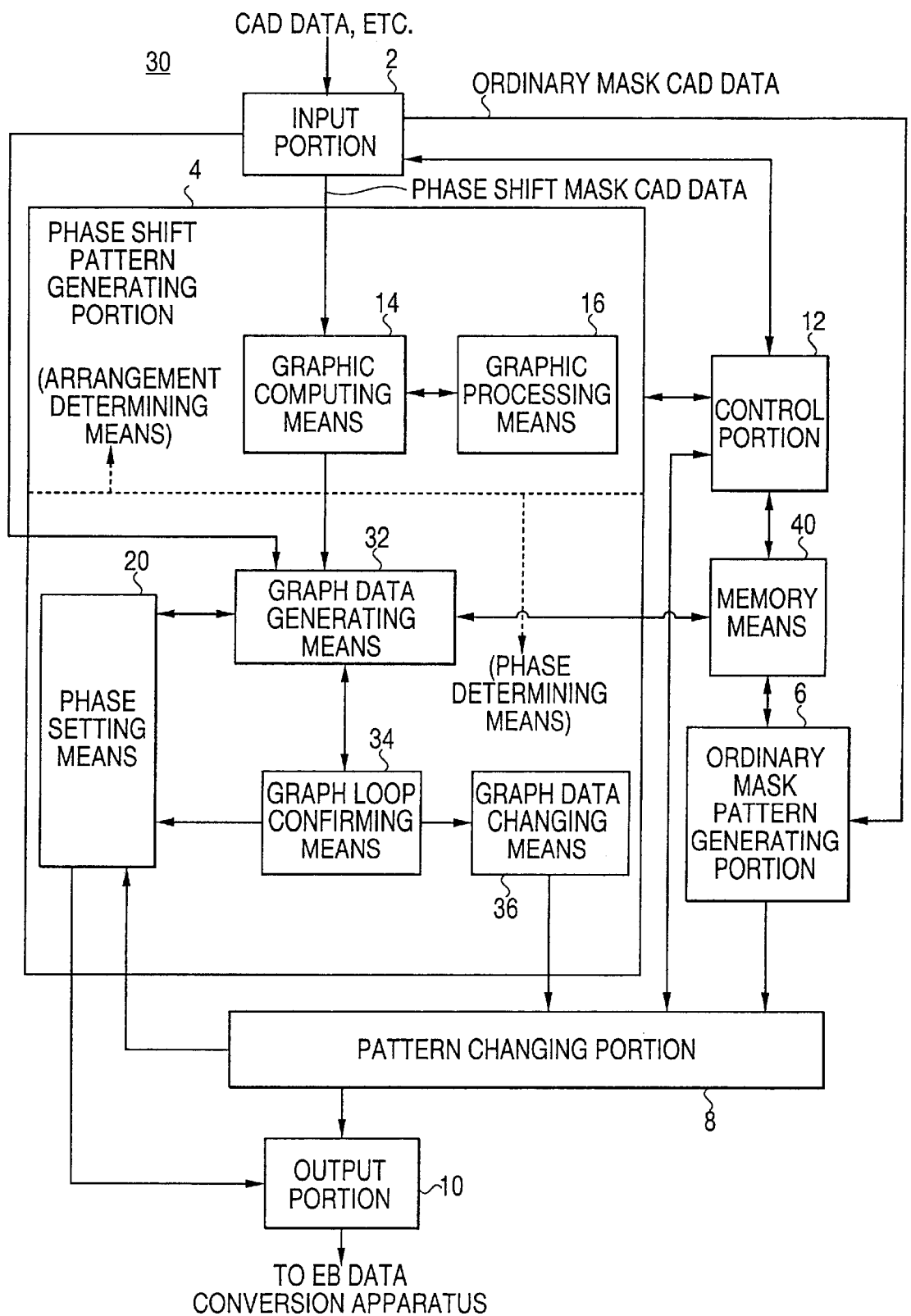
FIG. 8 is a block diagram of a schematic configuration of a pattern generating apparatus according to a second embodiment of the present invention.

FIG. 8 is a block diagram of the schematic configuration of a pattern generating apparatus according to the present embodiment, while FIG. 9 is a flow chart of a pattern generating method according to the present embodiment.

A pattern generating apparatus 30 of the present embodiment, when compared with the case of the first embodiment shown in FIG. 2, comprises a graph data generating means 32, graph loop confirming means 34, and graph data changing means 36 instead of the pattern searching means 18 and the phase difference confirming means 22. Also, in the present embodiment, a memory means 40 is added. Functions of the means 32, 36, 38, and 40 will be explained later on. The rest of the configuration is the same as that in the first embodiment. However, the flow of pattern data between the pattern changing portion 8, phase setting means 20, and output portion 10 is a little different from that in the first embodiment.

In the pattern generating method of the present embodiment, the routine up to step ST2 in FIG. 9 is the same as in the first embodiment. The flow chart of FIG. 4 can be used as it is in the present embodiment as well.

At step ST3 in FIG. 9, graph data is prepared by the graph data generating means 32 of FIG. 8.

Figure 10A:
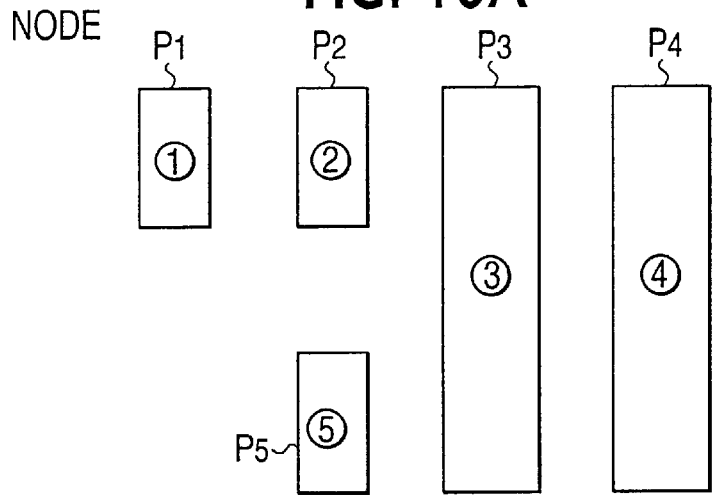
FIGS. 10A to 10C are views of the elements of graph data and a structural example of the data.
Figure 10B:
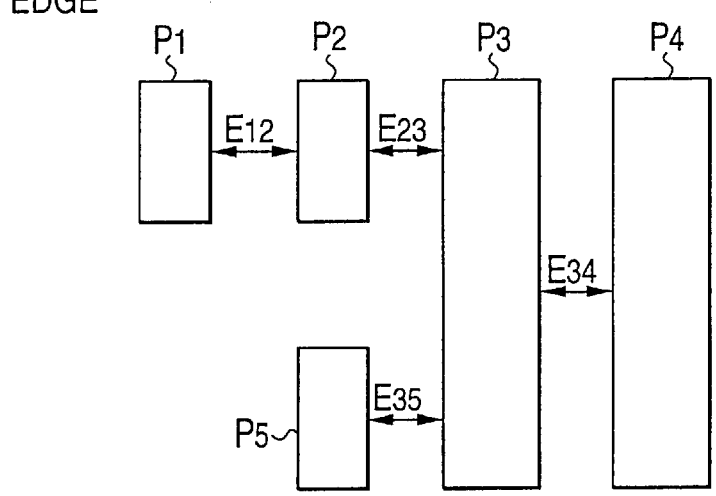
Figure 10C:
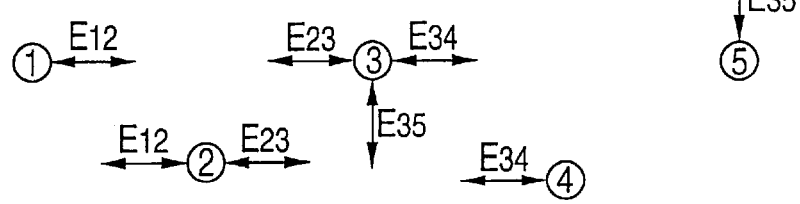

FIGS. 10A to 10C are views of the elements of graph data and a structural example of the data.

Graph data is comprised of two elements called a "node" and an "edge". A node is information indicating the phase shift pattern formed. In the example in FIG. 10A, nodes $\hat{1}$, $\hat{2}$, ... $\hat{5}$ respectively correspond to the phase shift patterns P1, P2, ... P5. Also, an edge is information indicating the positional relationship between phase shift patterns, for example, the fact that the distance in the direction of gate length is the fine line width. In the example in FIG. 10B, the fact that each distance between the phase shift patterns P1 and P2, between P2 and P3, between P3 and P4, and between P3 and P5 is a fine line width is expressed by the edges E12, E23, E34, and E35.

The information is stored in the memory means 40 of FIG. 8. As its specific storage structure (data base), there are three kinds of data bases, for example, a list of nodes (phase shift pattern identifying information), a list of edges (information of phase shift patterns adjoining with a fine line width) and a pattern edge list for each node (information of patterns adjoining phase shift patterns). FIG. 10C expresses a pattern edge list for each node as an example of a data base. Note that when the CAD design is carried out on a cell basis, there are three kinds of data bases for each kind of cell.

When defining an edge in generating such graph data, the edge can be detected by the method of successively examining the relationships between adjoining patterns for example in the same way as the pattern search of the first embodiment.

FIG. 11A shows two examples of the graph data expressed by the nodes and edges in a graphic form (graphic) and its corresponding pattern. If using the graph data in this way, it is possible to graph a plurality of patterns at distances of exactly the minimum line width of the fine gate patterns all together.

At the next step ST4, for example, the graph generating means 32 judges whether the generated graphic is a closed loop or not. When it is not a closed loop as in the example in FIG. 11A, the flow proceeds to step ST5 where in the same way as in the first embodiment the phases are determined by the phase setting means 20 (FIG. 11B) and the phase shift patterns and phase information are output from the output portion 10.

On the other hand, in the case where the generated graphic is a closed loop, the flow proceeds to step ST6 where it is confirmed if the number of closed loop node is even (even-number loop) or odd (odd-number loop). The loop is confirmed by the graph confirming means 34 of FIG. 8.

Figure 12A:
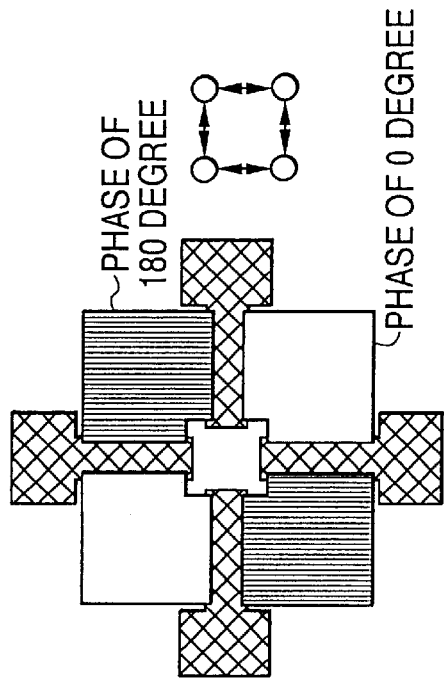
FIGS. 12A to 12C are views of a pattern and graph showing an example of cases where the closed loop is an even number closed loop and an odd number closed loop.
Figure 12C:
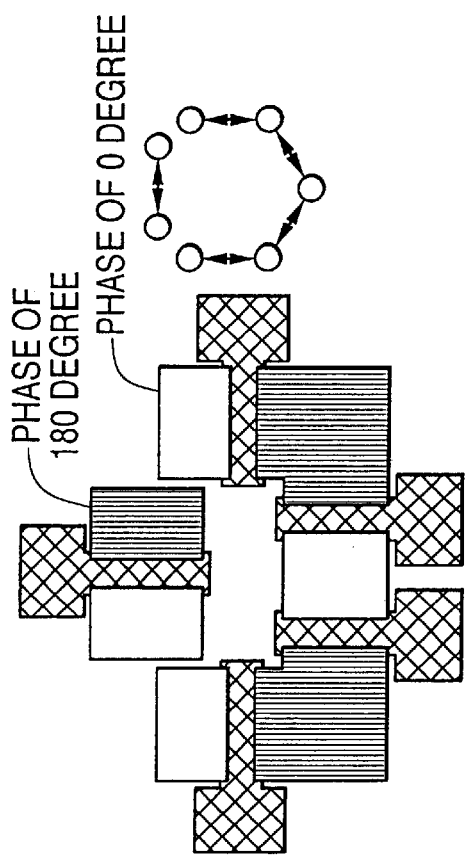
Figure 12B:
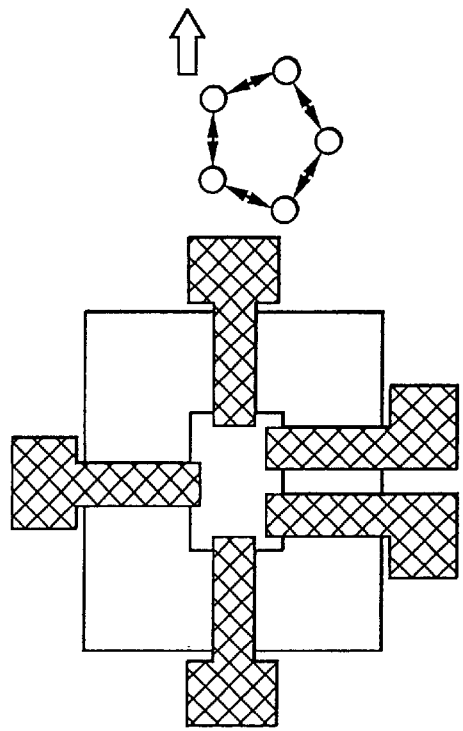

FIG. 12A shows an example of an even-number loop, while FIG. 12B shows an example of an odd-number loop. In the even-number loop of FIG. 12A, since in principal no phase mismatch can occur, the phases are set (step ST5) in the same way as in the first embodiment and the results are output. As opposed to this, in an odd-number loop of FIG. 12B, since it is clear a phase mismatch occurs, the processing flow proceeds to step ST7 without attempting to set the phases even once and the graph data is changed by the graph data changing means 36 of FIG. 8.

At the next step ST8, the pattern is changed in the same way as in the first embodiment, that is, the layout of the gate pattern is changed or the layout is compressed (or expanded), then the phases are set (step ST5) and the results are output.

Note that basically any location of the graph may be changed at the previous step ST7, but if this is done, the phase mismatch cannot necessarily be smoothly eliminated by changing the layout or performing compression (expansion) once.

Therefore, as a modification, if the width of each gate shift pattern in the direction of gate length in addition to identifying information of each pattern is included in the node of the graph data, it is instantaneously judged if the width is great enough to enable addition of a phase shift pattern and therefore it is easy to specify a location suitable for changing the graph. Due to this, it becomes possible, in changing a pattern, to immediately determine the phase by simply adding a phase shift pattern, that is, without any phase mismatch. Also, even in a case where a pattern change is necessary, the amount of movement of the gate pattern or the layout compression (or expansion) rate can be predicted in advance based on the information of the width of the pattern in the direction of gate length and the pattern change can be completed at one time.

FIG. 12C illustrates a graphic and pattern after change to eliminate phase mismatch in each of the above methods.

Note that, in the present embodiment as well, when there is a pattern change in the second ordinary exposure, the change is carried out together in the same way as the first embodiment.

In the second embodiment, in addition to similar effects as in the first embodiment, there is the advantage that the phase can be determined on a graph. Furthermore, once the graph data is prepared, a linked search of the patterns becomes unnecessary and the number of repetitions of confirmation of the phase difference and settings of the phase can be reduced. Namely, in the first embodiment, the phase is set by actually searching for the pattern. When a phase mismatch occurs, a pattern is changed and the phase difference is confirmed and the phase set again. It is necessary to repeat the process. In the present embodiment, however, the existence of a phase mismatch can be easily learned by a simple judgement of whether the related graph data group (graphics) is a closed loop and if a closed loop of the number of nodes is even or odd and therefore it is possible to immediately change the pattern or take other steps, so the efficiency is improved further. Since this graph data is simple being only the minimum information required for determining the phase. By storing the data for each pattern and updating it for every change of the pattern, time and work spent for preparing and changing the graph data are far smaller compared with the usefulness of the graph data (improvement of efficiency of pattern generation).

Third Embodiment

The present embodiment is an embodiment relating to reduction of the variations in line width due to the rough and fine degree of the fine patterns. This embodiment can be carried out by itself as well as combined with the above embodiments.

Figure 13A:
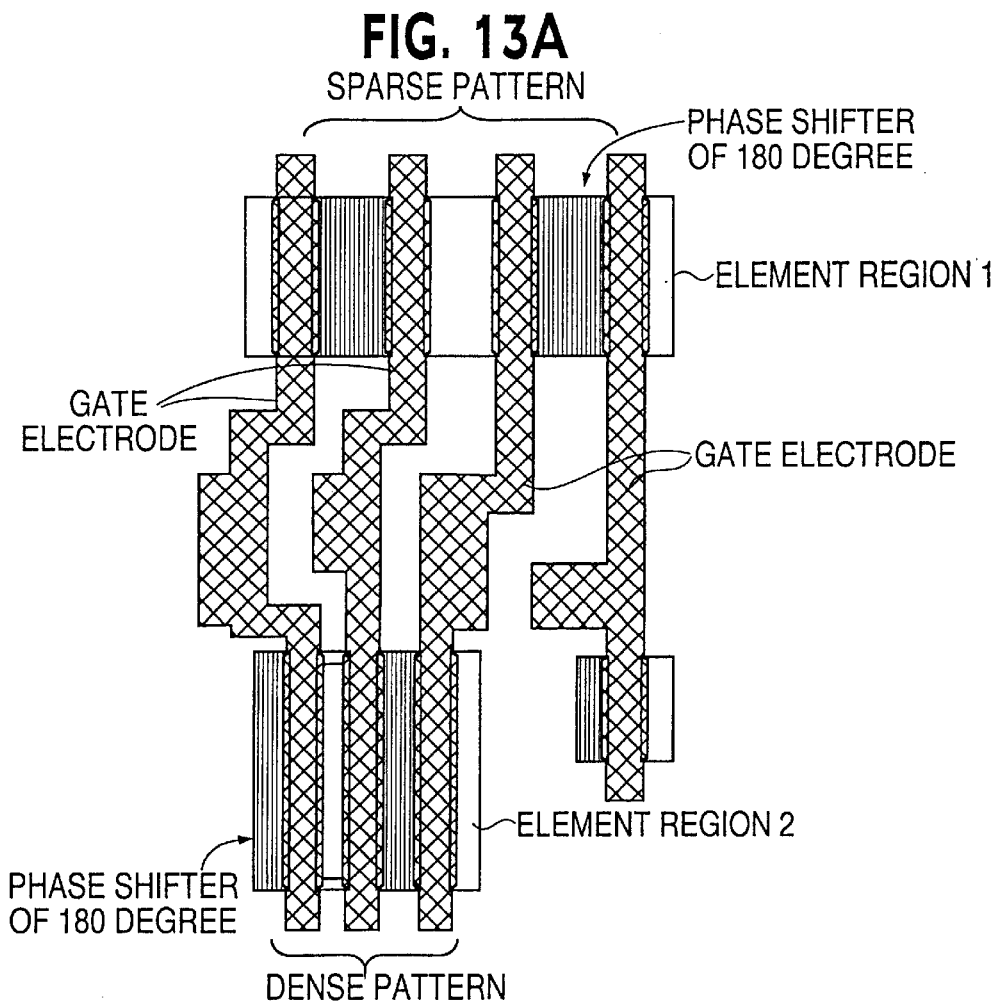
FIGS. 13A and 13B are views of an example of a pattern having different densities and results of simulation of the light intensity for explaining the variation in line width due to the density of the fine patterns.
Figure 13B:
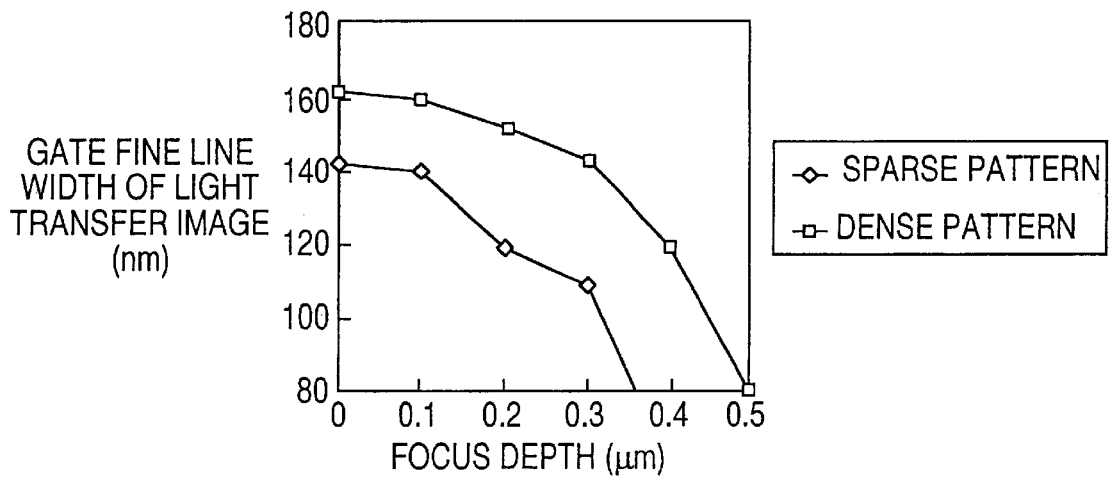

FIGS. 13A and 13B are views for explaining variations in line width due to the rough and fine degree of fine patterns, in which FIG. 13A is a plan view of rough and fine degree of fine patterns, while FIG. 13B is a graph of the results of simulation of light intensity for forming a gate by the phase shift pattern generating method of the second embodiment. In FIG. 13A, the patterns of the element region pattern, gate electrode pattern, and pattern of the 180-degree shifter are superposed and form a gate pattern having wide intervals (sparse pattern) in an element region 1 and a gate pattern having narrow intervals (dense pattern) in an element region 2. In the graph of FIG. 13B, the abscissa indicates the focal depth and the ordinate indicates a fine line width of the gate of a light transferred image.

From the results of simulation of FIG. 13B, it is learned that gate line width after image-development differs tremendously (>20 nm) between the sparse pattern and dense pattern in a wide range of focal depth. In the results, there is a tendency for the fine line width of the gate to become thicker in the sparse pattern. To correct such a line width difference due to the rough and fine degree of the gate intervals, it is necessary to make the gate line width on the current photo mask thinner at the sparse pattern side.

However, the fine line width of the fine patterns on the photo mask formed by a phase shift pattern is already a mask line width thin to the limit in the photo mask manufacturing process. Accordingly, it is not preferable to make it thinner in a direction narrowing the margin in the process for manufacturing a photo mask.

Therefore, in this embodiment, the variations due to the difference densities of the gate line widths are corrected by changing the line widths of the gate light blocking pattern on the mask for ordinary exposure which is laid over the gate resolution pattern (resist latent image) due to phase shift exposure in ordinary exposure.

The light blocking pattern on the mask for ordinary exposure is usually formed somewhat thicker in the direction of fine line width considering mask misalignment with the gate resolution pattern. As a result, the light blocking pattern is a design rule not as strict as that for exposure wavelength. Accordingly, a change of the line width of a light blocking pattern is possible within a range where there are no problems in the process of manufacturing a photo mask.

Figure 14A:
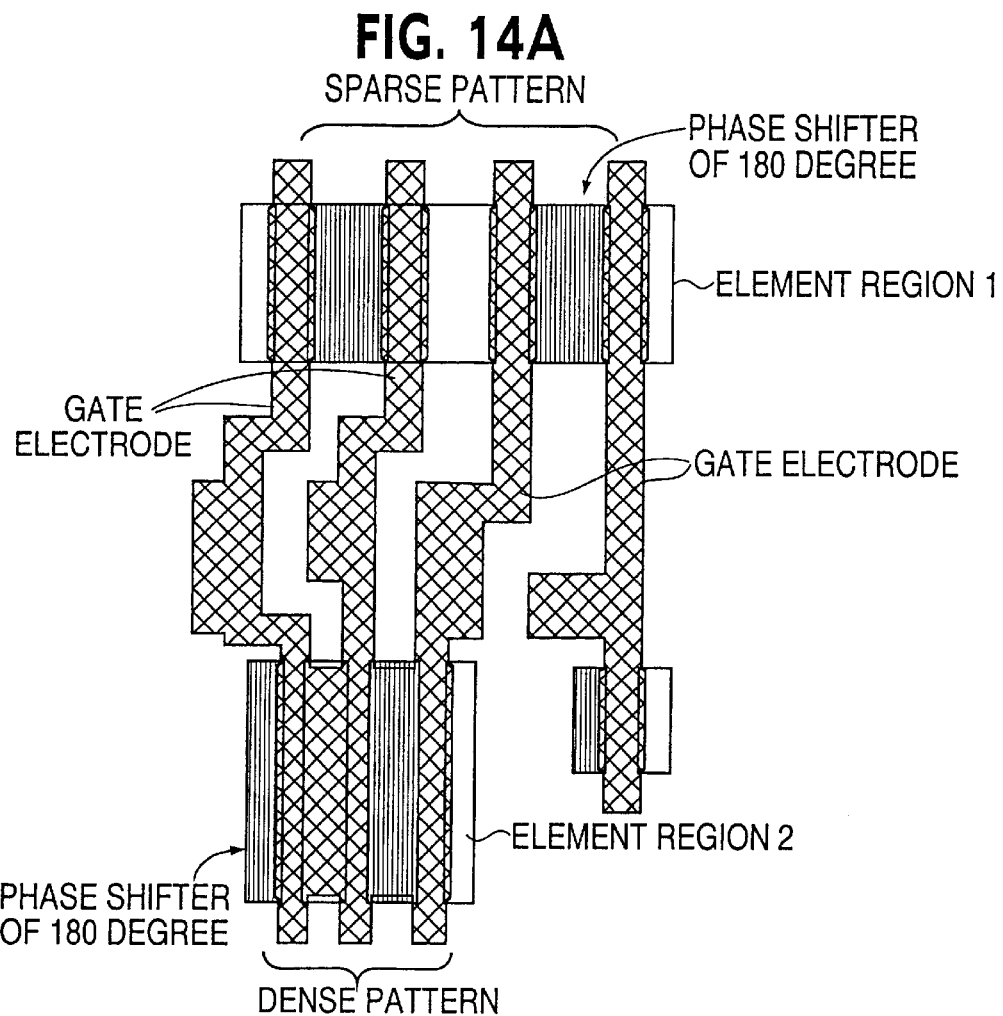
FIGS. 14A and 14B are views of a pattern when actually changing the line width of a light blocking pattern and correcting a line width difference caused by the different densities of the gate intervals and of the results of simulation of the light intensity.
Figure 14B:
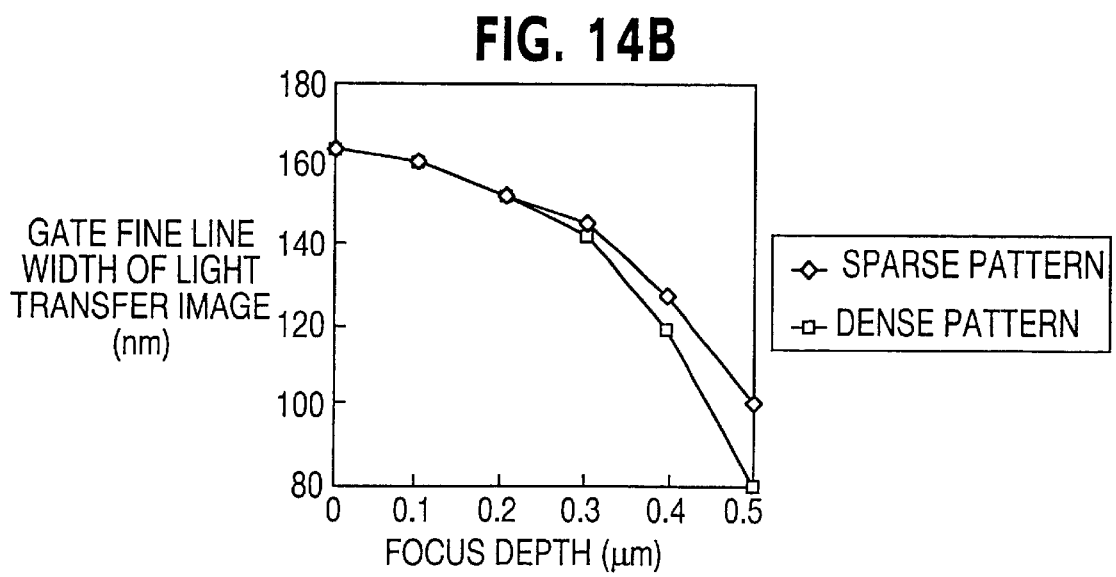

FIGS. 14A and 14B are plan views of a pattern of results of actually changing the line width of a light blocking pattern to correct the line width difference caused by the rough and fine degree of gate intervals and shows the results of simulation of the light intensity.

The line width difference depending on the rough and fine degree of intervals of arrangement of fine gate patterns can be corrected by widening the width of the light blocking patterns used for the second ordinary exposure. In the example of FIGS. 14A and 14B, it is formed by connecting all light blocking patterns in dense patterns in the width direction.

From the results of simulation of the light intensity when using the light blocking patterns after change, it was learned that it is true that the line widths of the fine patterns do not depend on the pattern intervals and that the line width differences due to the rough and fine degree of the gate intervals occurring in the case of the same light blocking pattern and regardless of the rough and fine degree of the pattern of the related art can be corrected to a satisfactory level. Also, since the mask pattern and minimum line width do not have to be changed, it is not necessary to make strict specifications for line width in preparing a photo mask.

Finally, a technique for generating a light blocking pattern used in the second and later ordinary exposures will be explained in a case of rough and fine degree of the fine gate patterns. Note that the routine for generating a basic light blocking pattern for ordinary exposure, other than the change of light blocking pattern for correcting a line width difference due to rough and fine degree of patterns discussed here, can also be applied to the first and second embodiments. Note that when working the first or second embodiments, a light blocking pattern for ordinary exposure is basically generated by the ordinary mask pattern generating portion 6 of FIG. 2 or FIG. 8 unless specially referred to otherwise.

FIGS. 15A to 15F are plan views of a pattern in different steps for generating a light blocking pattern for ordinary exposure.

Figure 15A:
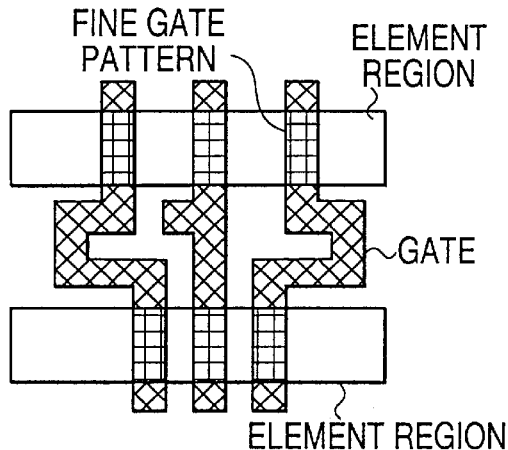
FIGS. 15A to 15F are plane views of a pattern in each process for generating a light blocking pattern for ordinary exposure.

First, in FIG. 15A, graphical AND processing (AND processing) is carried out on a gate electrode pattern and an element region pattern to extract a fine gate pattern in the same way as when generating the above phase shift pattern. The pattern is extracted by providing in the ordinary pattern generating portion 6 the same function as the graphic computing means 14 of FIG. 2 and FIG. 8 or by making dual use of the graphic computing means 14.

Figure 15B:
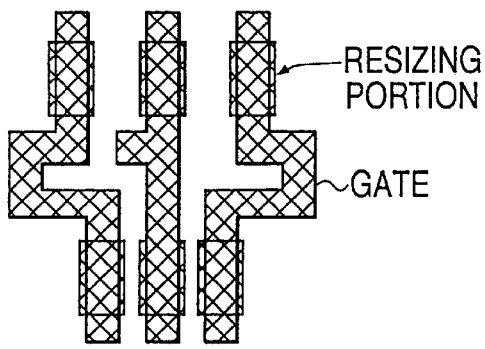

In the next FIG. 15B, predetermined resizing is applied to the two sides of the extracted pattern in the direction of fine line width (direction of gate length). The resizing is carried out by providing in the ordinary pattern generating portion 6 the same function as the graphic processing means 16 of FIG. 2 and FIG. 8 or by making dual use of the graphic processing means 16.

Figure 15C:
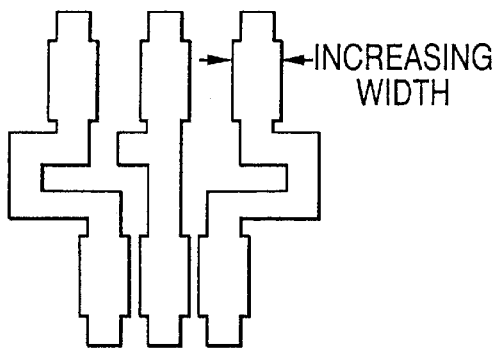

In FIG. 15C, graphical OR processing (OR processing) is carried out on the resized fine pattern and the gate electrode pattern to generate a light blocking pattern by the same means as in the AND processing of FIG. 15A.

Figure 15D:
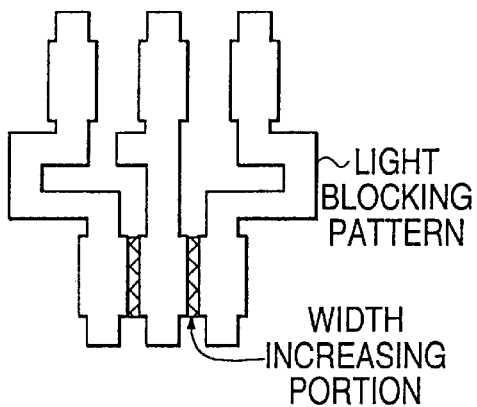
Figure 15E:
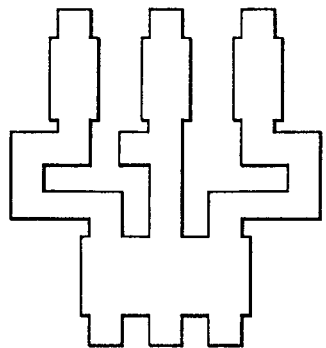
Figure 15F:
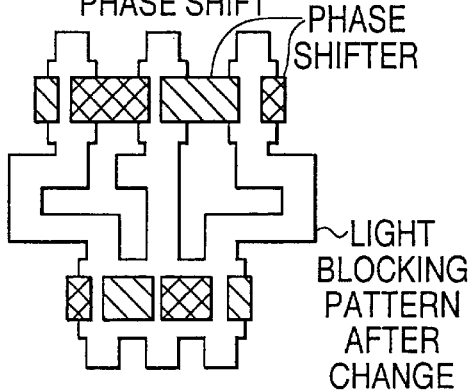
Figure 18:
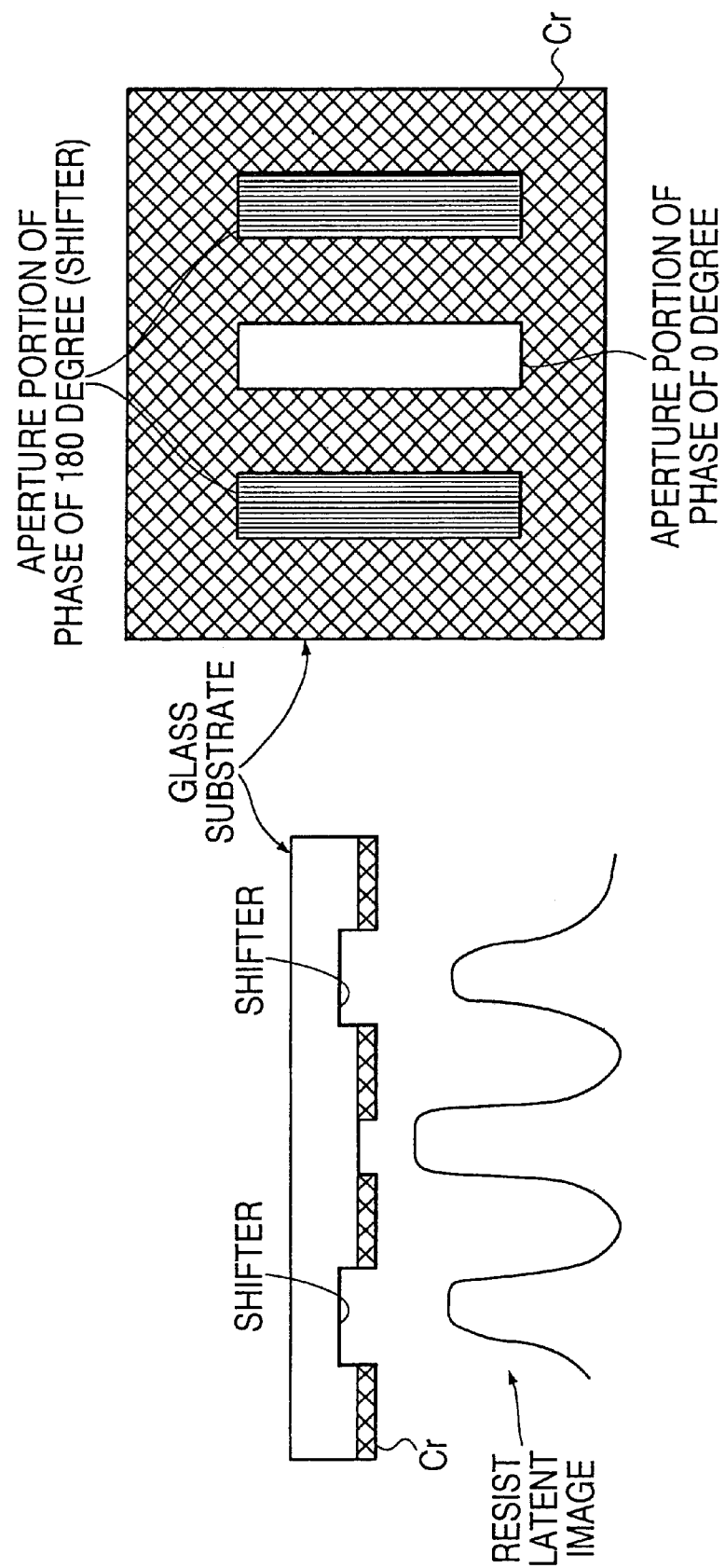
FIG. 18 is a view of the principle of a so-called Levenson type phase shift using a negative resist - a prerequisite of a first prior art.

Usually, the generation of a light blocking pattern is completed at this stage, but in the present embodiment, in FIG. 15D, the light blocking pattern is partially increased in width. The processing is carried out through the steps of specifying dense patterns by a pattern search and enlarging the width at the dense pattern portion. Specifying the dense patterns is carried out by providing in the ordinary pattern generating portion 6 the same function as the pattern searching means 18 of FIG. 2 or by making dual use of the pattern searching means 18. For example, patterns where the intervals with the adjoining patterns are less than a predetermined width are detected as dense patterns while those where they are more than the predetermined width are detected as sparse patterns. The width of the dense pattern portions is increased a predetermined amount inside the intervals of patterns of the dense pattern portion detected by this technique. In the present example, the width is increased until eliminating the intervals between adjoining dense patterns. Due to this, a changed light blocking pattern shown in FIG. 15E can be obtained. The changed light blocking pattern becomes as shown in FIG. 15F in relationship with a phase shifter.

In the above third embodiment, as is obvious from the comparison of FIG. 13B and FIG. 14B, by changing the size of the light blocking pattern for ordinary exposure at the fine gate pattern interval portion to separate the patterns, it is possible to reduce or correct the fine line width difference after image-development generated in accordance with the rough and fine degree of the phase shift patterns in the direction of fine line width. The pattern is corrected at the second and later ordinary exposure pattern where the specifications of line width are not as strict as in a phase shift mask, so there is the advantage that there is a room for pattern correction beyond the fine line width difference and correction of fine line width difference is made easier.

According to the pattern generating method and apparatus for the same according to the present invention, since the shapes and phases of the phase shift patterns are determined based on the positional relationships of fine patterns, once the shape and arrangement of the fine patterns are determined, automation for successively generating phase shift patterns becomes easier. Since the phase is determined so as to give a 180-degree phase difference between adjoining locations via the fine patterns, successive automated phase determination also becomes easy.

The fact that this technique is suited to automation contributes largely to improved processing efficiency when repetition of the same processing is necessary such as confirmation of phase difference and determination of a phase over again especially due to a change of a pattern when there is a phase mismatch.

Also, since the shapes and phases of the phase shift patterns are obtained based on the positional relationships of fine patterns, the phase shift patterns can be arranged adjoining each other with a phase difference of 180 degrees in any direction within a two-dimensional plane. Accordingly, the fine patterns do not have to be in parallel and there are less constraints than in the prior art.

Furthermore, when graphing the phase shift patterns, phases can be determined without actual pattern searching. The existence of a phase mismatch, that is, whether a pattern change is necessary or not, can be learned before determining the phase, so the efficiency of the processing is improved.

On the other hand, by correcting the light blocking pattern for ordinary exposure, the line width difference after image-development generated in accordance with rough and fine degree of the fine patterns of the high resolution exposure in the direction of fine line width can be reduced or corrected without being subject to the constraints of the resolution limit.

Note that the present invention is not limited to the above embodiments and includes modifications within the scope of the claims.

What is claimed is:

1. An exposure method for a semiconductor using a mask pattern including a plurality of fine patterns and a plurality of phase shift patterns arranged at the two sides of said fine patterns in a direction of fine line width to eliminate light interference due to a phase difference of light passing through, comprising the steps of:

determining shapes and phases of the plurality of phase shift patterns based on positional relationships of the plurality of fine patterns and then determining the phases to give a phase difference of 180 degrees at the two sides of said fine patterns;

extracting said plurality of fine patterns from already designed element shape patterns;

arranging unit patterns of at least a predetermined width required for canceling said light interference at the two sides in the direction of fine line width for each of the extracted plurality of the fine patterns, and generating said plurality of phase shift patterns using said unit patterns.

2. An exposure method for a semiconductor using a mask pattern as set forth in claim 1, wherein said unit patterns are arranged while changing the width in said direction of fine line width so that no clearance can be formed at the opposite sides of the fine patterns and said phase shift patterns are generated by obtaining graphical OR's of the arranged unit patterns.

3. An exposure method for a semiconductor using a mask pattern as set forth in claim 1, wherein said phases are determined while searching for adjoining phase shift patterns straddling said fine patterns so that phase differences between the adjoining phase shift patterns successively become 180 degrees.

4. An exposure method for a semiconductor using a mask pattern as set forth in claim 1, wherein the pattern generating method is applied to generating a mask pattern for high resolution exposure for resolution of said fine patterns in forming mask patterns for forming a single layer by a plurality of exposures including said high resolution exposure and ordinary exposure for locations other than the fine patterns.

5. An exposure method for a semiconductor using a mask pattern as set forth in claim 1, wherein when there is a phase mismatch giving a phase difference of 0 degree, a pattern is changed to eliminate said phase mismatch.

6. A exposure method as set forth in claim 5, wherein when changing the pattern, a phase shift pattern having a width in said direction of fine line width of at least two times a predetermined width required for canceling said light interference is identified and the pattern is changed to divide said identified phase shift pattern into two phase shift patterns having a phase difference of 180 degrees.

7. An exposure method for a semiconductor using a mask pattern as set forth in claim 5, wherein said pattern is changed to compress or expand the overall layout pattern by applying a constraint to specific phase shift patterns and then changing the design rule of patterns or between patterns.

8. An exposure method for a semiconductor using a mask pattern as set forth in claim 1, wherein a relationship between said phase shift patterns is expressed as a graph having phase shift patterns as nodes and the relationships between the phase shift patterns as branches and the phases are determined on the graph.

9. An exposure method for a semiconductor using a mask pattern as set forth in claim 5, wherein a relationship between said phase shift patterns is expressed as a graph having phase shift patterns as node and relationships between the phase shift patterns as branches, existence of said phase mismatch is judged using said graph, when there is a phase mismatch, said graph is corrected in accordance with a distance between said fine patterns, and said pattern is changed by using said graph after correction.

10. An exposure method for a semiconductor using a mask pattern used when forming a single layer by a plurality of exposures, said exposure method comprising the steps of:

performing a high resolution exposure using a plurality of fine patterns and a plurality of phase shift patterns arranged at the two sides of the fine patterns in the direction of fine line width for canceling light interference due to the phase difference of passing light; and performing an ordinary exposure for locations other than the fine patterns, wherein when generating a mask pattern used for said ordinary exposure, changing a size of a light blocking pattern on said mask for ordinary exposure superposed at a position corresponding to a said fine pattern on said mask for high resolution exposure in a direction reducing a line width difference after image-development caused by the different densities of said fine line patterns.

* * * * *